United States Patent
Chainer et al.

(10) Patent No.: US 9,936,607 B2
(45) Date of Patent: *Apr. 3, 2018

(54) FABRICATING COOLED ELECTRONIC SYSTEM WITH LIQUID-COOLED COLD PLATE AND THERMAL SPREADER

(71) Applicant: INTERNATIONAL BUSINESS MACHINES CORPORATION, Armonk, NY (US)

(72) Inventors: Timothy J. Chainer, Putnam Valley, NY (US); David P. Graybill, Staatsburg, NY (US); Madhusudan K. Iyengar, Foster City, CA (US); Vinod Kamath, Raleigh, NC (US); Bejoy J. Kochuparambil, Apex, NC (US); Roger R. Schmidt, Poughkeepsie, NY (US); Mark E. Steinke, Durham, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 436 days.

This patent is subject to a terminal disclaimer.

(21) Appl. No.: 14/564,265

(22) Filed: Dec. 9, 2014

(65) Prior Publication Data
US 2015/0114602 A1    Apr. 30, 2015

Related U.S. Application Data

(63) Continuation of application No. 13/102,200, filed on May 6, 2011, now Pat. No. 9,307,674.

(51) Int. Cl.
*F28D 15/02* (2006.01)
*H05K 7/20* (2006.01)

(52) U.S. Cl.
CPC ......... *H05K 7/20336* (2013.01); *F28D 15/02* (2013.01); *H05K 7/20509* (2013.01); *H05K 7/20772* (2013.01); *H05K 7/20936* (2013.01)

(58) Field of Classification Search
CPC ............. H05K 7/20254; H05K 7/2039; H05K 7/20418; H05K 7/20336; H05K 7/20509;
(Continued)

(56) References Cited

U.S. PATENT DOCUMENTS

| | | | |
|---|---|---|---|
| 3,807,493 | A | 4/1974 | Stewart |
| 5,168,921 | A | 12/1992 | Meyer |

(Continued)

FOREIGN PATENT DOCUMENTS

| | | |
|---|---|---|
| CN | 201222836 Y | 4/2009 |
| DE | 199 25 983 A1 | 12/2000 |

(Continued)

OTHER PUBLICATIONS

Chainer et al., Office Action for U.S. Appl. No. 13/102,200, filed May 6, 2011 (U.S. Patent Publication No. 2012/0279686 A1), dated Jun. 30, 2015 (27 pages).

(Continued)

*Primary Examiner* — Len Tran
*Assistant Examiner* — Hans Weiland
(74) *Attorney, Agent, or Firm* — Teddi Maranzano; Kevin P. Radigan, Esq.; Heslin, Rothenberg, Farley & Mesiti, P.C.

(57) ABSTRACT

Methods are provided for facilitating cooling of an electronic component. The methods include providing a liquid-cooled cold plate and a thermal spreader associated with the cold plate. The cold plate includes multiple coolant-carrying channel sections extending within the cold plate, and a thermal conduction surface with a larger surface area than a surface area of the component to be cooled. The thermal (Continued)

spreader includes one or more heat pipes including multiple heat pipe sections. One or more heat pipe sections are partially aligned to a first region of the cold plate, that is, where aligned to the surface to be cooled, and partially aligned to a second region of the cold plate, which is outside the first region. The one or more heat pipes facilitate distribution of heat from the electronic component to coolant-carrying channel sections of the cold plate located in the second region of the cold plate.

9 Claims, 20 Drawing Sheets

(58) Field of Classification Search
CPC ............ H05K 7/20772; H05K 7/20936; H01L 23/427; H01L 23/473; F28D 15/02; F28D 2021/0028
USPC .............. 165/80.4, 104.33, 168; 361/697.52, 361/679.53, 699, 702
See application file for complete search history.

(56) References Cited

U.S. PATENT DOCUMENTS

| | | | |
|---|---|---|---|
| 5,414,591 A | 5/1995 | Kumura et al. | |
| 5,794,454 A | 8/1998 | Harris et al. | |
| 5,829,516 A * | 11/1998 | Lavochkin | H01L 23/473 165/171 |
| 6,011,371 A | 1/2000 | Van Brocklin et al. | |
| 6,263,959 B1 | 7/2001 | Ikeda et al. | |
| 6,305,180 B1 | 10/2001 | Miller et al. | |
| 6,400,045 B1 | 6/2002 | Hosokawa et al. | |
| 6,411,512 B1 | 6/2002 | Mankaruse et al. | |
| 6,434,000 B1 | 8/2002 | Pandolfi et al. | |
| 6,462,949 B1 | 10/2002 | Parish et al. | |
| 6,480,014 B1 | 11/2002 | Li et al. | |
| 6,548,894 B2 | 4/2003 | Chu et al. | |
| 6,557,354 B1 | 5/2003 | Chu et al. | |
| 6,657,121 B2 * | 12/2003 | Garner | H05K 7/20681 361/700 |
| 6,775,137 B2 | 8/2004 | Chu et al. | |
| 6,924,981 B2 | 8/2005 | Chu et al. | |
| 6,934,118 B2 | 8/2005 | Hidaka et al. | |
| 7,002,799 B2 | 2/2006 | Malone et al. | |
| 7,017,655 B2 * | 3/2006 | Wilson | H01L 23/473 165/104.33 |
| 7,042,726 B2 | 5/2006 | Cader et al. | |
| 7,151,668 B1 | 12/2006 | Stathakis | |
| 7,165,412 B1 | 1/2007 | Bean, Jr. | |
| 7,221,569 B2 | 5/2007 | Tsai | |
| 7,233,501 B1 | 6/2007 | Ingalz | |
| 7,273,090 B2 | 9/2007 | Crocker et al. | |
| 7,286,355 B2 | 10/2007 | Cheon | |
| 7,310,737 B2 | 12/2007 | Patel et al. | |
| 7,361,985 B2 | 4/2008 | Yuan et al. | |
| 7,365,985 B1 | 4/2008 | Ni | |
| 7,385,810 B2 | 6/2008 | Chu et al. | |
| 7,388,749 B1 | 6/2008 | Feroli et al. | |
| 7,395,851 B2 | 7/2008 | Lee et al. | |
| 7,420,804 B2 | 9/2008 | Leija et al. | |
| 7,436,663 B2 | 10/2008 | Matsushima et al. | |
| 7,440,278 B2 | 10/2008 | Cheng | |
| 7,443,672 B2 | 10/2008 | Peng et al. | |
| 7,450,385 B1 | 11/2008 | Campbell et al. | |
| 7,469,551 B2 | 12/2008 | Tilton et al. | |
| 7,520,316 B2 * | 4/2009 | Xia | H01L 23/427 165/104.21 |
| 7,522,418 B2 | 4/2009 | Ishimine | |
| 7,551,440 B2 | 6/2009 | Belady et al. | |
| 7,573,714 B2 | 8/2009 | Ali | |
| 7,583,043 B2 | 9/2009 | Chung et al. | |
| 7,595,550 B2 | 9/2009 | Cady et al. | |
| 7,626,820 B1 | 12/2009 | Konshak et al. | |
| 7,660,109 B2 | 2/2010 | Iyengar et al. | |
| 7,684,196 B2 | 3/2010 | Eckberg et al. | |
| 7,701,714 B2 | 4/2010 | Shabany | |
| 7,703,291 B2 | 4/2010 | Bushnik et al. | |
| 7,746,634 B2 | 6/2010 | Hom et al. | |
| 7,746,642 B2 | 6/2010 | Lai et al. | |
| 7,791,882 B2 | 9/2010 | Chu et al. | |
| 7,796,393 B2 | 9/2010 | Lengen et al. | |
| 7,796,399 B2 | 9/2010 | Clayton et al. | |
| 7,817,412 B2 | 10/2010 | Sullivan | |
| 7,826,216 B2 | 11/2010 | Moss | |
| 7,830,657 B2 | 11/2010 | Chu et al. | |
| 7,855,890 B2 | 12/2010 | Kashirajima et al. | |
| 7,907,406 B1 | 3/2011 | Campbell et al. | |
| 7,950,244 B2 | 5/2011 | Iyengar et al. | |
| 7,969,736 B1 | 6/2011 | Iyengar et al. | |
| 7,986,528 B2 | 7/2011 | Aoki | |
| 7,990,709 B2 | 8/2011 | Campbell et al. | |
| 8,018,718 B2 | 9/2011 | Goth et al. | |
| 8,027,162 B2 | 9/2011 | Campbell et al. | |
| 8,035,972 B2 | 10/2011 | Ostwald et al. | |
| 8,170,724 B2 | 5/2012 | Kelley et al. | |
| 8,208,258 B2 | 6/2012 | Campbell et al. | |
| 8,274,787 B2 | 9/2012 | Alyaser et al. | |
| 8,351,206 B2 | 1/2013 | Campbell et al. | |
| 8,437,129 B2 | 5/2013 | Tung et al. | |
| 8,493,738 B2 | 7/2013 | Chainer et al. | |
| 8,599,557 B2 | 12/2013 | Peterson et al. | |
| 8,649,177 B2 | 2/2014 | Chainer et al. | |
| 8,687,364 B2 | 4/2014 | Chainer et al. | |
| 8,760,855 B2 | 6/2014 | Howes et al. | |
| 8,867,205 B2 | 10/2014 | Eagle | |
| 2001/0000880 A1 | 5/2001 | Chu et al. | |
| 2004/0250989 A1 | 12/2004 | Im et al. | |
| 2005/0068728 A1 | 3/2005 | Chu et al. | |
| 2005/0174735 A1* | 8/2005 | Mankaruse | H05K 7/20336 361/695 |
| 2005/0178529 A1 | 8/2005 | Suzuki | |
| 2005/0180113 A1 | 8/2005 | Shirakami et al. | |
| 2006/0146497 A1 | 7/2006 | Gauche et al. | |
| 2006/0221578 A1 | 10/2006 | Foster et al. | |
| 2006/0250770 A1 | 11/2006 | Campbell et al. | |
| 2006/0250772 A1 | 11/2006 | Salmonson et al. | |
| 2007/0034356 A1 | 2/2007 | Kenny et al. | |
| 2007/0076376 A1 | 4/2007 | Mongia et al. | |
| 2007/0146990 A1 | 6/2007 | Hsieh | |
| 2007/0187069 A1 | 8/2007 | Ueno et al. | |
| 2007/0227708 A1* | 10/2007 | Hom | H01L 23/473 165/121 |
| 2007/0227709 A1 | 10/2007 | Upadhya et al. | |
| 2007/0263356 A1 | 11/2007 | Weber et al. | |
| 2007/0263359 A1 | 11/2007 | Lai et al. | |
| 2007/0291452 A1 | 12/2007 | Gilliland et al. | |
| 2008/0060791 A1 | 3/2008 | Strobel et al. | |
| 2008/0101035 A1 | 5/2008 | Chen | |
| 2008/0112075 A1 | 5/2008 | Farquhar et al. | |
| 2008/0123300 A1 | 5/2008 | Tian et al. | |
| 2008/0155990 A1 | 7/2008 | Gupta et al. | |
| 2008/0239564 A1 | 10/2008 | Farquhar et al. | |
| 2008/0259566 A1 | 10/2008 | Fried | |
| 2008/0259567 A1 | 10/2008 | Campbell et al. | |
| 2008/0310105 A1 | 12/2008 | Cheng | |
| 2008/0313492 A1 | 12/2008 | Hansen | |
| 2009/0002951 A1 | 1/2009 | Legen et al. | |
| 2009/0080151 A1 | 3/2009 | Kalms et al. | |
| 2009/0086432 A1 | 4/2009 | Campbell et al. | |
| 2009/0120607 A1 | 5/2009 | Cheon et al. | |
| 2009/0122488 A1 | 5/2009 | Iyengar et al. | |
| 2009/0126909 A1 | 5/2009 | Ellsworth, Jr. et al. | |
| 2009/0133866 A1 | 5/2009 | Campbell et al. | |
| 2009/0177334 A1 | 7/2009 | Artman et al. | |
| 2009/0190304 A1 | 7/2009 | Meyer et al. | |
| 2009/0201640 A1 | 8/2009 | Bard et al. | |
| 2009/0201644 A1 | 8/2009 | Kelley et al. | |
| 2009/0207564 A1 | 8/2009 | Campbell et al. | |
| 2009/0207567 A1 | 8/2009 | Campbell et al. | |
| 2009/0219687 A1 | 9/2009 | Lin | |
| 2009/0260782 A1* | 10/2009 | Whitney | F28D 15/0233 165/104.21 |

(56) References Cited

U.S. PATENT DOCUMENTS

| | | | |
|---|---|---|---|
| 2009/0268404 A1 | 10/2009 | Chu et al. | |
| 2009/0277614 A1 | 11/2009 | Lin et al. | |
| 2009/0277616 A1 | 11/2009 | Cipolla et al. | |
| 2009/0284924 A1 | 11/2009 | Konshak et al. | |
| 2010/0000720 A1* | 1/2010 | Li | H01L 23/427 165/104.33 |
| 2010/0002510 A1 | 2/2010 | Cipolla et al. | |
| 2010/0027220 A1 | 2/2010 | Hughes et al. | |
| 2010/0085712 A1 | 4/2010 | Hrehor et al. | |
| 2010/0126696 A1 | 5/2010 | Novotny et al. | |
| 2010/0126700 A1 | 5/2010 | Chen | |
| 2010/0142147 A1 | 6/2010 | Chang et al. | |
| 2010/0149754 A1 | 6/2010 | Chapel et al. | |
| 2010/0252234 A1 | 10/2010 | Campbell et al. | |
| 2010/0263855 A1 | 10/2010 | Arimilli et al. | |
| 2010/0296239 A1* | 11/2010 | Alyaser | H01L 23/473 361/679.53 |
| 2010/0313590 A1 | 12/2010 | Campbell et al. | |
| 2011/0051372 A1 | 3/2011 | Barringer et al. | |
| 2011/0056674 A1 | 3/2011 | Campbell et al. | |
| 2011/0060470 A1 | 3/2011 | Campbell et al. | |
| 2011/0069454 A1 | 3/2011 | Campbell et al. | |
| 2011/0197612 A1 | 8/2011 | Campbell et al. | |
| 2011/0205705 A1 | 8/2011 | Graybill et al. | |
| 2011/0232889 A1 | 9/2011 | Eckberg et al. | |
| 2011/0313576 A1 | 12/2011 | Nicewonger | |
| 2011/0315353 A1 | 12/2011 | Campbell et al. | |
| 2012/0026670 A1 | 2/2012 | Fau et al. | |
| 2012/0279047 A1 | 11/2012 | Chainer et al. | |
| 2012/0279233 A1 | 11/2012 | Chainer et al. | |
| 2012/0279686 A1 | 11/2012 | Chainer et al. | |
| 2012/0281358 A1 | 11/2012 | Chainer et al. | |
| 2012/0281359 A1 | 11/2012 | Arney et al. | |
| 2013/0107453 A1 | 5/2013 | Chainer et al. | |
| 2013/0135812 A1 | 5/2013 | Barina et al. | |
| 2013/0138252 A1 | 5/2013 | Chainer et al. | |
| 2013/0138253 A1 | 5/2013 | Chainer et al. | |
| 2013/0174421 A1 | 5/2013 | Chainer et al. | |
| 2013/0194745 A1 | 8/2013 | Meijer et al. | |
| 2013/0342987 A1 | 12/2013 | Yang et al. | |
| 2013/0343005 A1 | 12/2013 | David et al. | |
| 2014/0078674 A1 | 3/2014 | Chainer et al. | |
| 2014/0078675 A1 | 3/2014 | Chainer et al. | |
| 2014/0123493 A1 | 5/2014 | Campbell et al. | |
| 2014/0069111 A1 | 8/2014 | Campbell et al. | |

FOREIGN PATENT DOCUMENTS

| | | |
|---|---|---|
| EP | 2 357 878 A2 | 1/2011 |
| JP | 01077199 A | 3/1989 |
| JP | 2010040886 A | 2/2010 |
| TW | 323643 U | 12/2007 |
| TW | 200937175 A | 9/2009 |
| WO | WO2011/025487 A1 | 3/2011 |

OTHER PUBLICATIONS

Chainer et al., Final Office Action for U.S. Appl. No. 14/086,128, filed Nov. 21, 2013 (U.S. Patent Publication No. 2014/0078675 A1), dated Dec. 2, 2015 (27 pages).

Chainer et al., Office Action for U.S. Appl. No. 14/086,114, filed Nov. 21, 2013 (U.S. Patent Publication No. 2014/0078674 A1), dated May 12, 2016 (17 pages).

Chainer et al., Office Action for U.S. Appl. No. 14/086,128, filed Nov. 21, 2013 (U.S. Patent Publication No. 2014/0078675 A1), dated Jun. 15, 2015 (19 pages).

Chainer et al., Office Action for U.S. Appl. No. 13/102,200, filed May 6, 2011 (U.S. Patent Publication No. 2012/0279686 A1), dated Mar. 19, 2015 (23 pages).

IBM Technical Disclosure, "Highly-Efficient Copper Rail Design for Optimized Cooling of DRAM Modules", IPCOM000184053D (Jun. 9, 2009).

Search Report issued by the Great Britain Intellectual Property Office (IPO) for GB Application No. 1216684.0, dated Jan. 14, 2013 (7 pages).

Notification of Transmittal of the International Search Report & the Written Opinion, issued for PCT Application No. PCT/EP2012/068516, dated Mar. 26, 2013 (10 pages).

Campbell et al., Office Action for U.S. Appl. No. 12/556,081, filed Sep. 24, 2009 (now U.S. Pat. No. 8,027,162 B2), dated Jan. 14, 2011 (25 pages).

Campbell et al., Notice of Allowance for U.S. Appl. No. 12/556,081, filed Sep. 24, 2009 (now U.S. Pat. No. 8,027,162 B2), dated May 20, 2011 (23 pages).

Chainer et al., Office Action for U.S. Appl. No. 13/102,211, filed May 6, 2011 (now U.S. Pat. No. 8,493,738 B2), dated Oct. 4, 2012 (32 pages).

Chainer et al., Notice of Allowance for U.S. Appl. No. 13/102,211, filed May 6, 2011 (now U.S. Pat. No. 8,493,738 B2), dated Mar. 25, 2013 (17 pages).

Chainer et al., Notice of Allowance for U.S. Appl. No. 13/451,714, filed Apr. 20, 2012 (now U.S. Pat. No. 8,649,177 B2), dated Jun. 14, 2013 (40 pages).

Chainer et al., Notice of Allowance for U.S. Appl. No. 13/451,714, filed Apr. 20, 2012 (now U.S. Pat. No. 8,649,177 B2), dated Aug. 27, 2013 (19 pages).

Chainer et al., Notice of Allowance for U.S. Appl. No. 13/283,933, filed Oct. 28, 2011 (now U.S. Pat. No. 8,687,364 B2), dated Aug. 26, 2013 (23 pages).

Chainer et al., Notice of Allowance for U.S. Appl. No. 13/283,933, filed Oct. 28, 2011 (now U.S. Pat. No. 8,687,364 B2), dated Nov. 12, 2013 (16 pages).

Chainer et al., Office Action for U.S. Appl. No. 13/305,967, filed May 30, 2013 (U.S. Patent Publication No. 2013/0138252 A1), dated Apr. 23, 2014 (10 pages).

Chainer et al., Notice of Allowance for U.S. Appl. No. 13/305,967, filed May 30, 2013 (U.S. Patent Publication No. 2013/0138252 A1), dated Sep. 15, 2014 (9 pages).

Chainer et al., Office Action for U.S. Appl. No. 13/705,300, filed Dec. 5, 2012 (U.S. Patent Publication No. 2013/0138253 A1), dated Apr. 22, 2014 (9 pages).

Chainer et al., Notice of Allowance for U.S. Appl. No. 13/705,300, filed Dec. 5, 2012 (U.S. Patent Publication No. 2013/0138253 A1), dated Sep. 10, 2014 (9 pages).

Chainer et al., Office Action for U.S. Appl. No. 13/102,195, filed May 6, 2011 (U.S. Patent Publication No. 2012/0279233 A1), dated Jul. 17, 2013 (38 pages).

Chainer et al., Office Action for U.S. Appl. No. 13/102,195, filed May 6, 2011 (U.S. Patent Publication No. 2012/0279233 A1), dated Feb. 4, 2014 (16 pages).

Chainer et al., Notice of Allowance for U.S. Appl. No. 13/102,195, filed May 6, 2011 (U.S. Patent Publication No. 2012/0279233 A1), dated May 29, 2014 (10 pages).

Chainer et al., Notice of Allowance for U.S. Appl. No. 13/102,195, filed May 6, 2011 (U.S. Patent Publication No. 2012/0279233 A1), dated Oct. 7, 2014 (10 pages).

David et al., Office Action for U.S. Appl. No. 13/527,947, filed Jun. 20, 2012 (U.S. Patent Publication No. 2013/0343005 A1), dated Feb. 13, 2014 (28 pages).

David et al., Notice of Allowance for U.S. Appl. No. 13/527,947, filed Jun. 20, 2012 (U.S. Patent Publication No. 2013/0343005 A1), dated Jun. 22, 2014 (20 pages).

Chainer et al., Restriction Requirement for U.S. Appl. No. 13/102,200, filed May 6, 2011 (U.S. Patent Publication No. 2012/0279686 A1), dated Sep. 24, 2013 (6 pages).

Chainer et al., Office Action for U.S. Appl. No. 13/102,200, filed May 6, 2011 (U.S. Patent Publication No. 2012/0279686 A1), dated Nov. 25, 2013 (48 pages).

Chainer et al., Office Action for U.S. Appl. No. 13/102,200, filed May 6, 2011 (U.S. Patent Publication No. 2012/0279686 A1), dated Apr. 4, 2014 (34 pages).

Chainer et al., Office Action for U.S. Appl. No. 13/102,200, filed May 6, 2011 (U.S. Patent Publication No. 2012/0279686 A1), dated Oct. 3, 2014 (30 pages).

(56) References Cited

OTHER PUBLICATIONS

Chainer et al., Office Action for U.S. Appl. No. 13/711,854, filed Dec. 12, 2012 (U.S. Patent Publication No. 2013/0174421 A1), dated Nov. 17, 2014 (11 pages).
O'Connor, Dan, "A Process Control Primer", Honeywell, Sensing and Control, Rev. 1, Jul. 2000 (144 pages).
Chainer et al., Non-Final Office Action for U.S. Appl. No. 14/562,867, filed Dec. 8, 2014, dated Mar. 16, 2017 (18 pages).
Chainer et al., Non-Final Office Action for U.S. Appl. No. 14/562,879, filed Dec. 8, 2014, dated Mar. 28, 2017 (19 pages).
Chainer et al., Non-Final Office Action for U.S. Appl. No. 14/086,114, filed Nov. 21, 2013, dated Apr. 3, 2017 (20 pages).
Chainer et al., Office Action for U.S. Appl. No. 14/562,867, filed Dec. 8, 2014 (U.S. Patent Publication No. 2015/0116941 A1), dated Sep. 18, 2017 (20 pages).

* cited by examiner

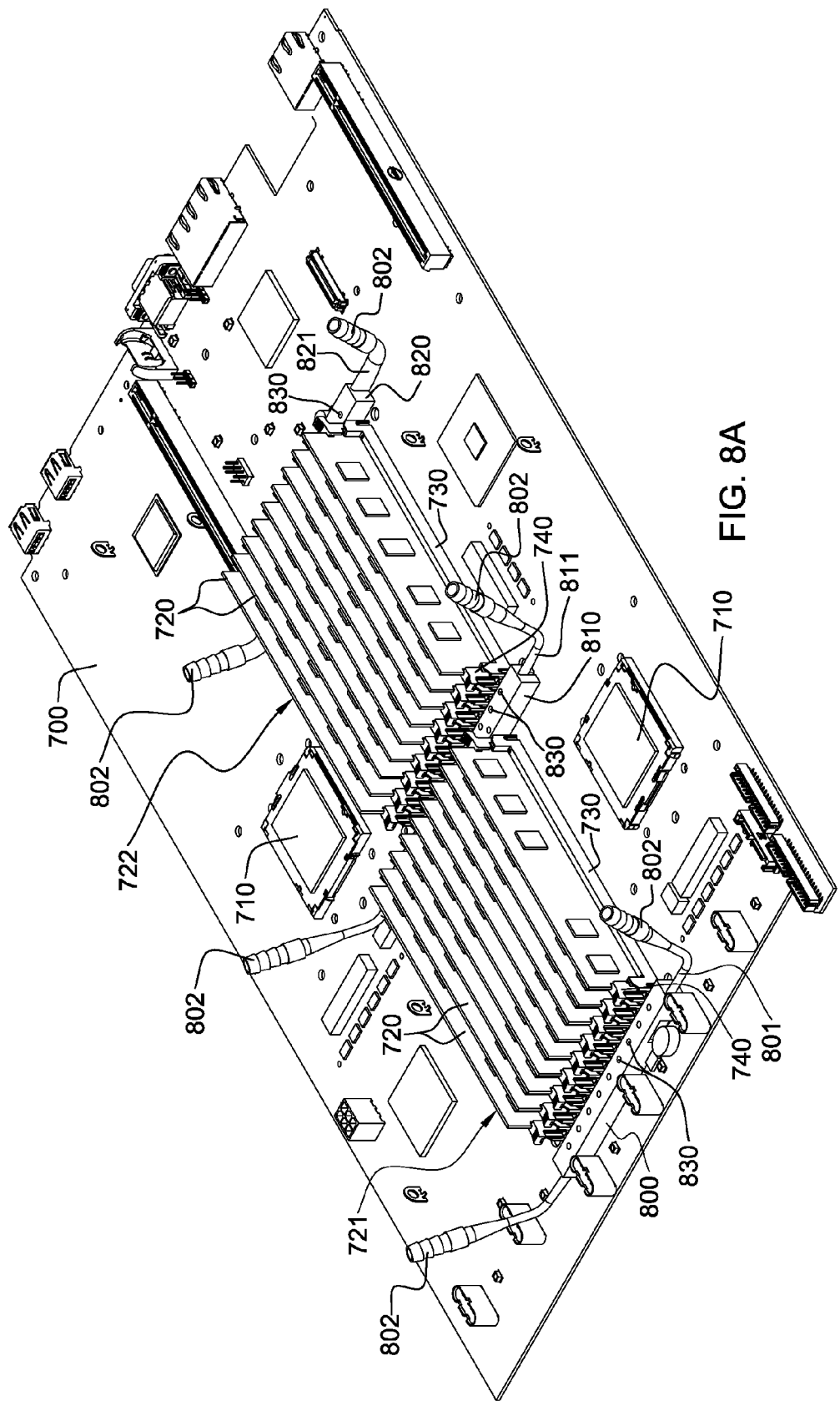

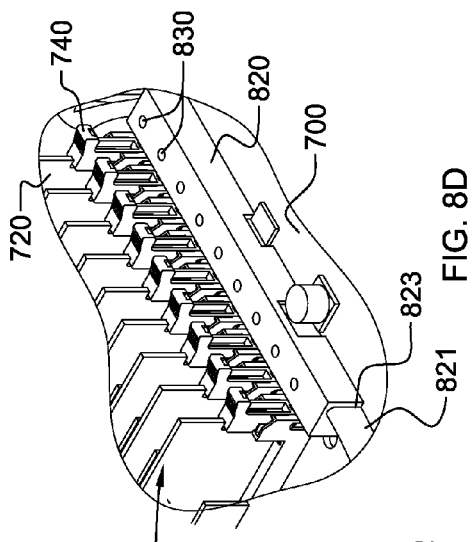
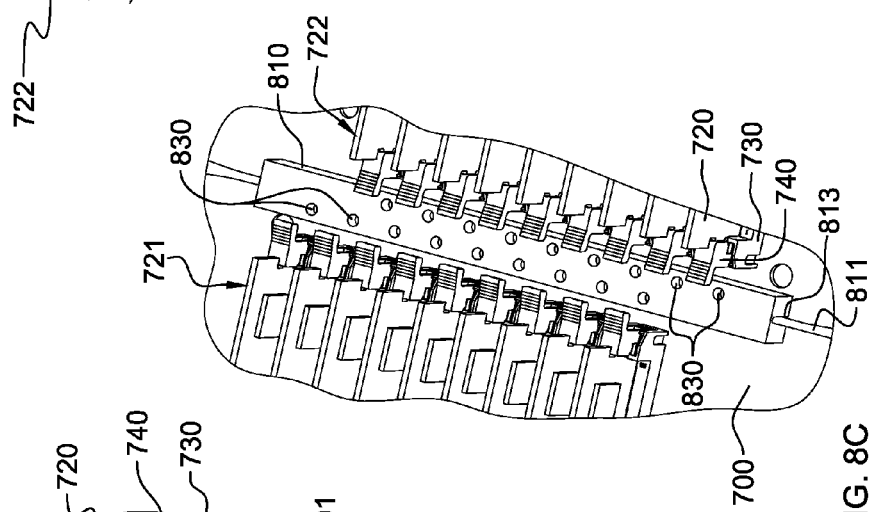
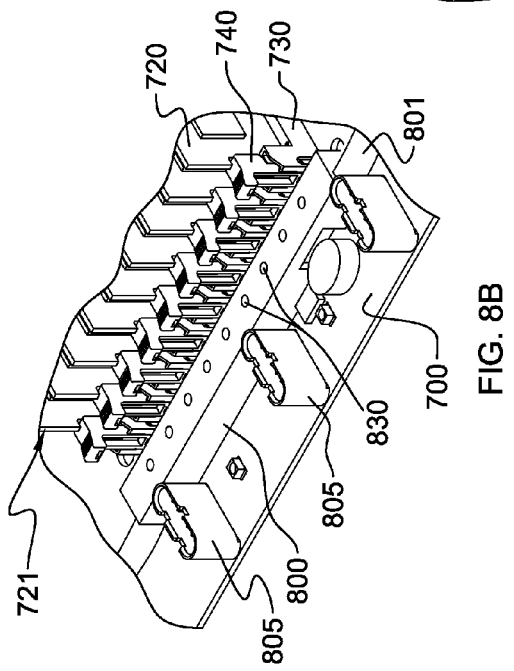
FIG. 8D
FIG. 8C
FIG. 8B

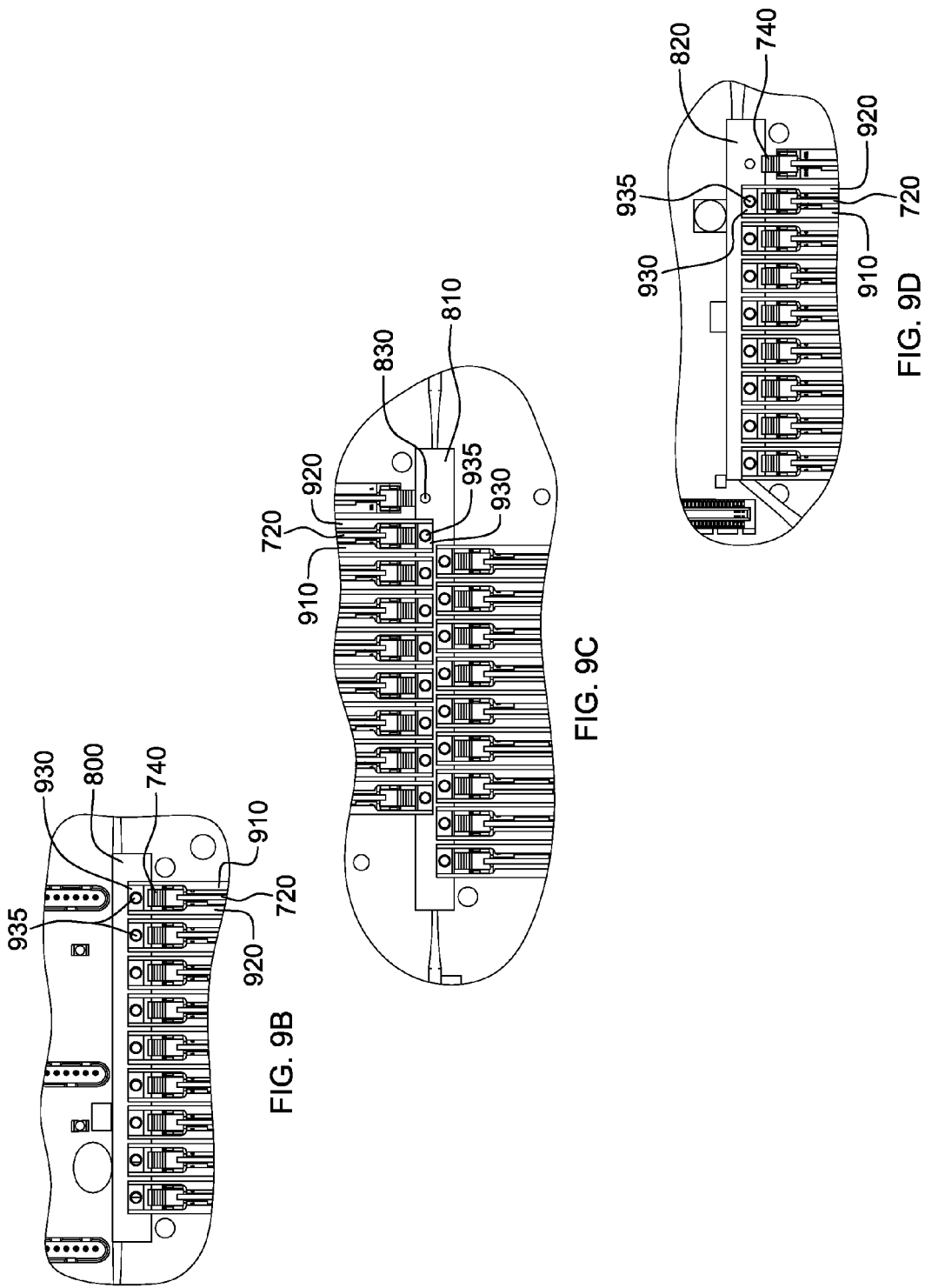

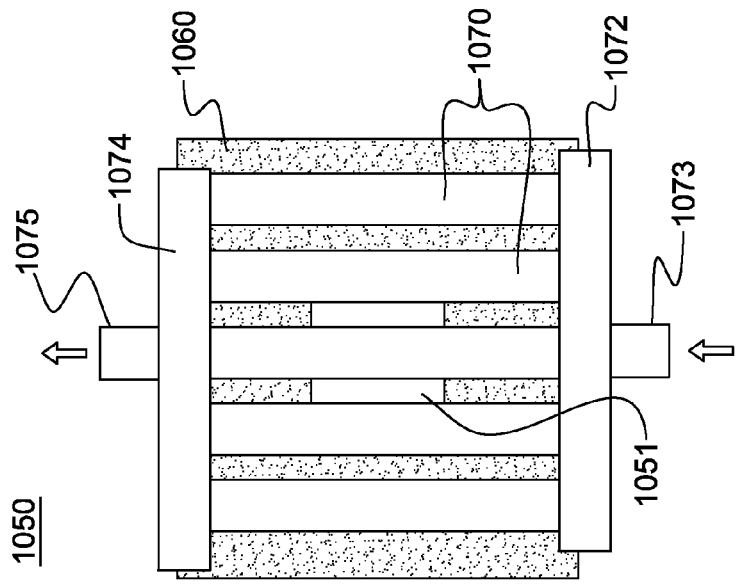
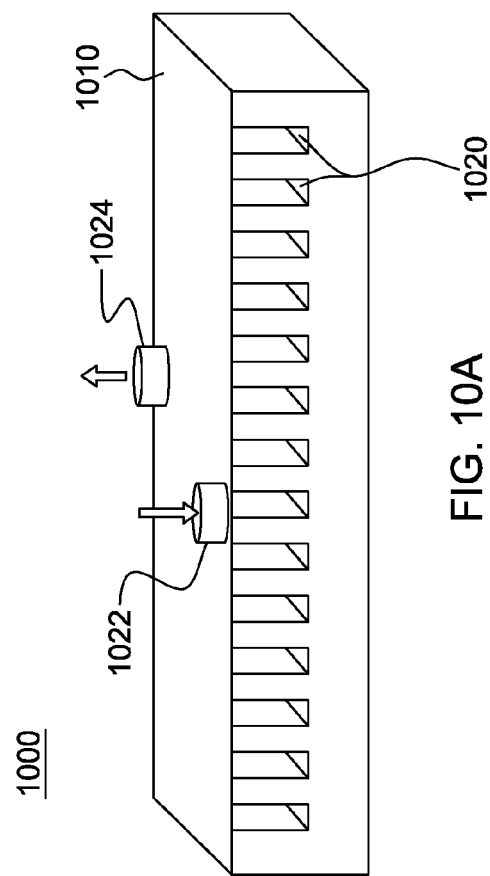

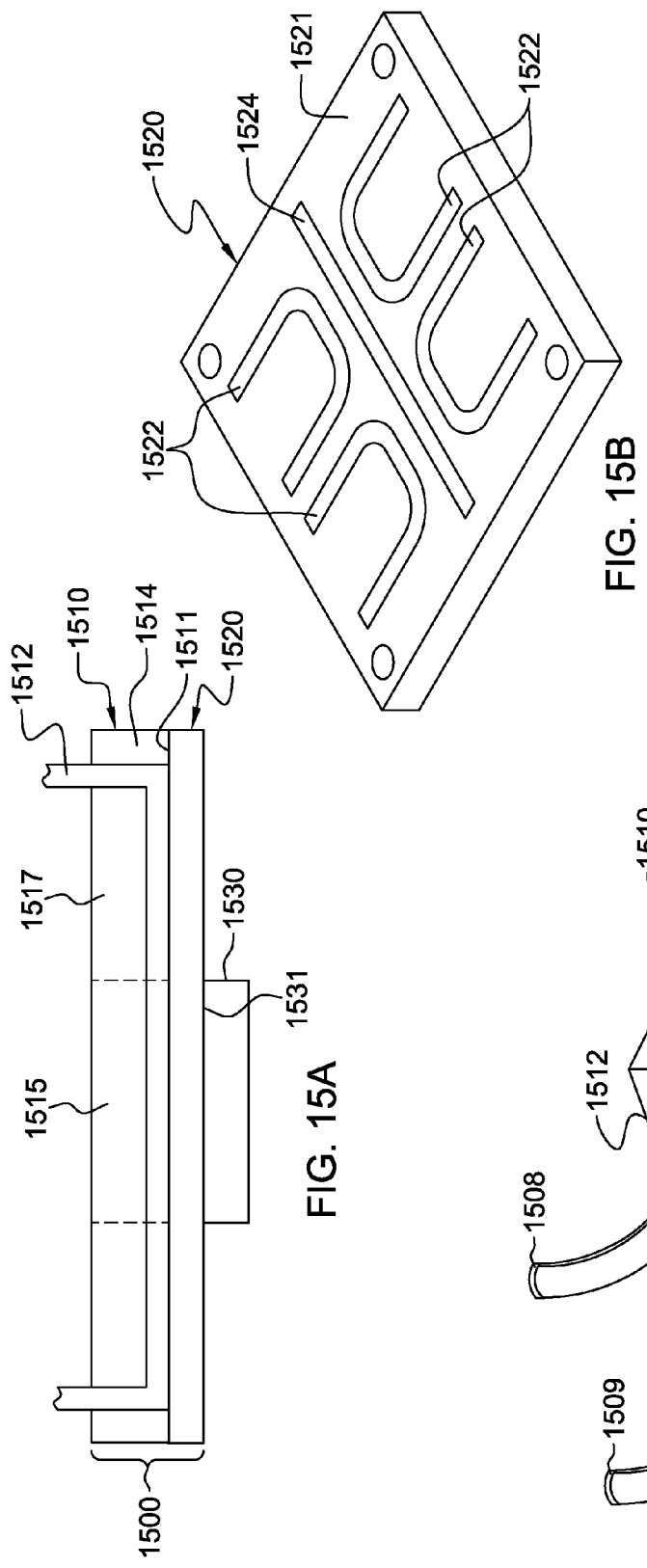

FABRICATING COOLED ELECTRONIC SYSTEM WITH LIQUID-COOLED COLD PLATE AND THERMAL SPREADER

CROSS-REFERENCE TO RELATED APPLICATION

This application is a continuation of U.S. Ser. No. 13/102,200, filed May 6, 2011, entitled, "Cooled Electronic System with Liquid-Cooled Cold Plate and Thermal Spreader Coupled to Electronic Component", which was published Nov. 8, 2012, as U.S. Patent Publication No. 2012/0279686 A1, which is hereby incorporated herein by reference in its entirety.

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

BRIEF SUMMARY

In one aspect, the shortcomings of the prior art are overcome and additional advantages are provided through the provision of a method of facilitating dissipation of heat from at least one electronic component. The method includes providing a cooling apparatus configured to couple to at least one electronic component to be cooled, the cooling apparatus having a larger footprint size than the at least one electronic component to be cooled, and the cooling apparatus including: a liquid-cooled cold plate comprising a thermally conductive material with a plurality of coolant-carrying channel sections extending therein, the liquid-cooled cold plate comprising a thermal conduction surface having a first surface area, and wherein the at least one electronic component comprises a surface to be cooled, the surface to be cooled comprising a second surface area, wherein the liquid-cooled cold plate is over-sized relative to the at least one electronic component, with the first surface area of the thermal conduction surface being greater than the second surface area of the surface to be cooled; and a thermal spreader in association with the liquid-cooled cold plate, the thermal spreader comprising at least one heat pipe having multiple heat pipe sections and having opposing first and second main surfaces, the first main surface of the thermal spreader being coupled to the thermal conduction surface of the liquid-cooled cold plate. The method further includes coupling the liquid-cooled cold plate with the associated thermal spreader to the surface to be cooled of the at least one electronic component, wherein the thermal spreader is disposed between the at least one electronic component and the liquid-cooled cold plate, and the liquid-cooled cold plate comprises a first region where the surface to be cooled aligns to the liquid-cooled cold plate and a second region outside of the first region, and wherein at least one coolant-carrying channel section of the plurality of coolant-carrying channel sections is disposed, at least in part, within the first region, and multiple coolant-carrying channel sections of the plurality of coolant-carrying channel sections of the liquid-cooled cold plate are disposed in the second region, outside the first region, and at least one heat pipe section of the multiple heat pipe sections is partially aligned to the first region of the liquid-cooled cold plate, between the at least one electronic component and the liquid-cooled cold plate, and partially aligned to the second region of the liquid-cooled cold plate, away from the at least one electronic component, the at least one heat pipe of the thermal spreader facilitating distribution of heat outward from the at least one electronic component to the multiple coolant-carrying channel sections of the liquid-cooled cold plate in the second region of the liquid-cooled cold plate.

In another aspect, a method is provided which includes: providing at least one electronic component; and providing a cooling apparatus coupled to the at least one electronic component for dissipating heat from the at least one electronic component. The cooling apparatus has a larger footprint size than the at least one electronic component, and includes: a liquid-cooled cold plate comprising a thermally conductive material with a plurality of coolant-carrying channel sections extending therein, the liquid-cooled cold plate comprising a thermal conduction surface having a first surface area, and wherein the at least one electronic component comprises a surface to be cooled, the surface to be cooled comprising a second surface area, wherein the liquid-cooled cold plate is over-sized relative to the at least one electronic component, with the first surface area of the thermal conduction surface of the liquid-cooled cold plate being greater than the second surface area of the surface to be cooled of the at least one electronic component, and in operation, heat is transferred from the surface to be cooled of the at least one electronic component to the thermal conduction surface of the liquid-cooled cold plate, and the liquid-cooled cold plate comprises a first region where the surface to be cooled aligns to the liquid-cooled cold plate and a second region outside the first region, and wherein at least one coolant-carrying channel section of the plurality of coolant-carrying channel sections is disposed, at least in part, within the first region, and multiple coolant-carrying channel sections of the plurality of coolant-carrying channel sections of the liquid-cooled cold plate are disposed in the second region, outside the first region; and a thermal spreader disposed between the at least one electronic component and the liquid-cooled cold plate and having opposing first and second main surfaces, the first main surface being coupled to the thermal conduction surface of the liquid-cooled cold plate, the thermal spreader comprising at least one heat pipe having multiple heat pipe sections, at least one heat pipe section of the multiple heat pipe sections being partially aligned to the first region of the liquid-cooled cold plate, between the at least one electronic component and the liquid-cooled cold plate, and partially aligned to the second region of the liquid-cooled cold plate, away from the at least one electronic component, the at least one heat pipe of the thermal spreader facilitating distribution of heat outward from the at least one electronic component to the multiple coolant-carrying channel sections of the liquid-cooled cold plate in the second region of the liquid-cooled cold plate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8A depicts the electronic system of FIG. 7, with first, second and third liquid-cooled cold rails of a cooling apparatus shown in place at the ends of first and second arrays of sockets and electronics cards of the electronic system, in accordance with one or more aspects of the present invention;

FIG. 8B is a partial depiction of the partially assembled cooled electronic system of FIG. 8A, and illustrating in greater detail, one embodiment of the first liquid-cooled cold rail disposed at one end of the parallel-disposed sockets that form part of the first array of electronics cards, in accordance with one or more aspects of the present invention;

FIG. 8C is a partial depiction of the second liquid-cooled cold rail disposed at the other end of the sockets comprising part of the first array of electronics cards, and shown disposed between the first and second arrays of electronics cards illustrated in FIG. 8A, in accordance with one or more aspects of the present invention;

FIG. 8D depicts one embodiment of the third liquid-cooled cold rail disposed at the other end of the sockets that form part of the second array of electronics cards illustrated in FIG. 8A, in accordance with one or more aspects of the present invention;

FIG. 9B is a partial depiction of the cooled electronic system of FIG. 9A, and illustrating interfacing of thermal spreaders to the first liquid-cooled cold rail at the one end of the sockets of the first array of electronics cards, in accordance with one or more aspects of the present invention;

FIG. 9C is a partial depiction of the cooled electronic system of FIG. 9A, and illustrating the second liquid-cooled cold rail disposed between the first and second arrays of electronics cards, and showing interfacing of thermal spreaders coupled to the first array of electronics cards, and thermal spreaders coupled to the second array of electronics cards to the second liquid-cooled cold rail, in accordance with one or more aspects of the present invention;

FIG. 9D is a partial depiction of the cooled electronic system of FIG. 9A, and illustrating interfacing of thermal spreaders associated with the second array of electronics cards to the third liquid-cooled cold rail of the cooled electronic system, in accordance with one or more aspects of the present invention;

FIG. 10A is a cross-sectional view of one embodiment of a cooling apparatus comprising a liquid-cooled cold plate with a plurality of coolant-carrying micro-channels formed therein, in accordance with one or more aspects of the present invention;

FIG. 10B is a plan view of an alternate embodiment of a cooling apparatus comprising a liquid-cooled cold plate, shown overlying an electronic component to be cooled, wherein the liquid-cooled cold plate comprises a plurality of coolant-carrying tubes embedded within the thermally conductive material of the cold plate, in accordance with one or more aspects of the present invention;

FIG. 15A is an elevational view of an alternate embodiment of a cooling apparatus comprising a liquid-cooled cold plate and a thermal spreader, in accordance with one or more aspects of the present invention;

FIG. 15B depicts one embodiment of a thermal spreader for the cooling apparatus of FIG. 15A, in accordance with one or more aspects of the present invention;

FIG. 15C depicts one embodiment of a liquid-cooled cold plate for the cooling apparatus of FIG. 15A, in accordance with one or more aspects of the present invention;

DETAILED DESCRIPTION

Figure 1:
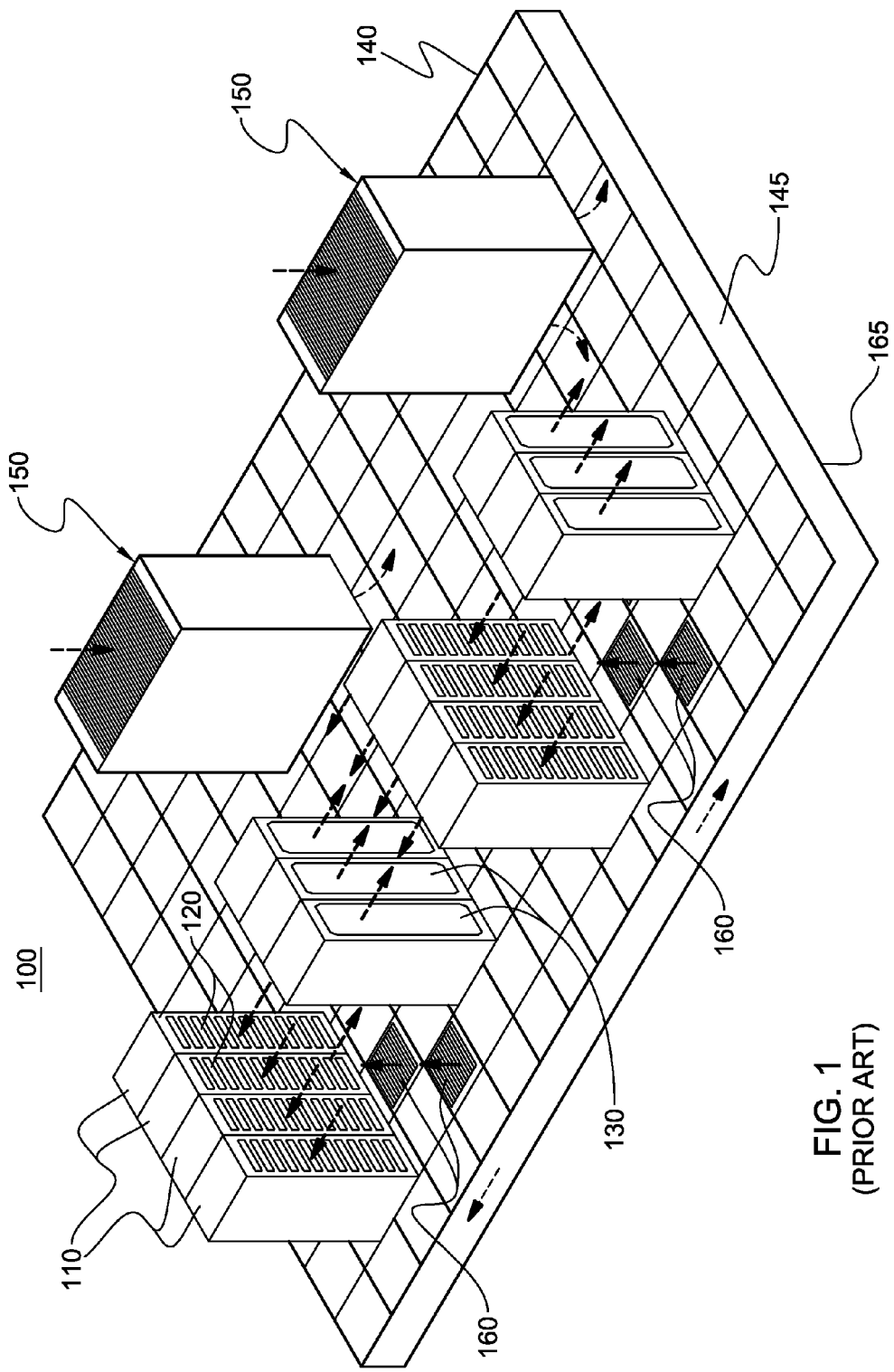
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards comprising a plurality of memory modules (such as one or more dual in-line memory modules (DIMMs)).

Further, as used herein, the terms "liquid-cooled structure", "liquid-cooled cold plate" and "liquid-cooled cold rail" refer to thermally conductive structures having one or more channels (or passageways) formed therein or passing therethrough, which facilitate the flow of liquid coolant through the structure. A liquid-cooled structure may be, for example, a liquid-cooled cold plate or a liquid-cooled cold rail. In one example, tubing is provided extending through the liquid-cooled structure. An "air-to-liquid heat exchanger" or "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

One example of coolant used within the cooled electronic apparatuses disclosed herein is water. However, the concepts presented are readily adapted to use with other types of coolant. For example, the coolant may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
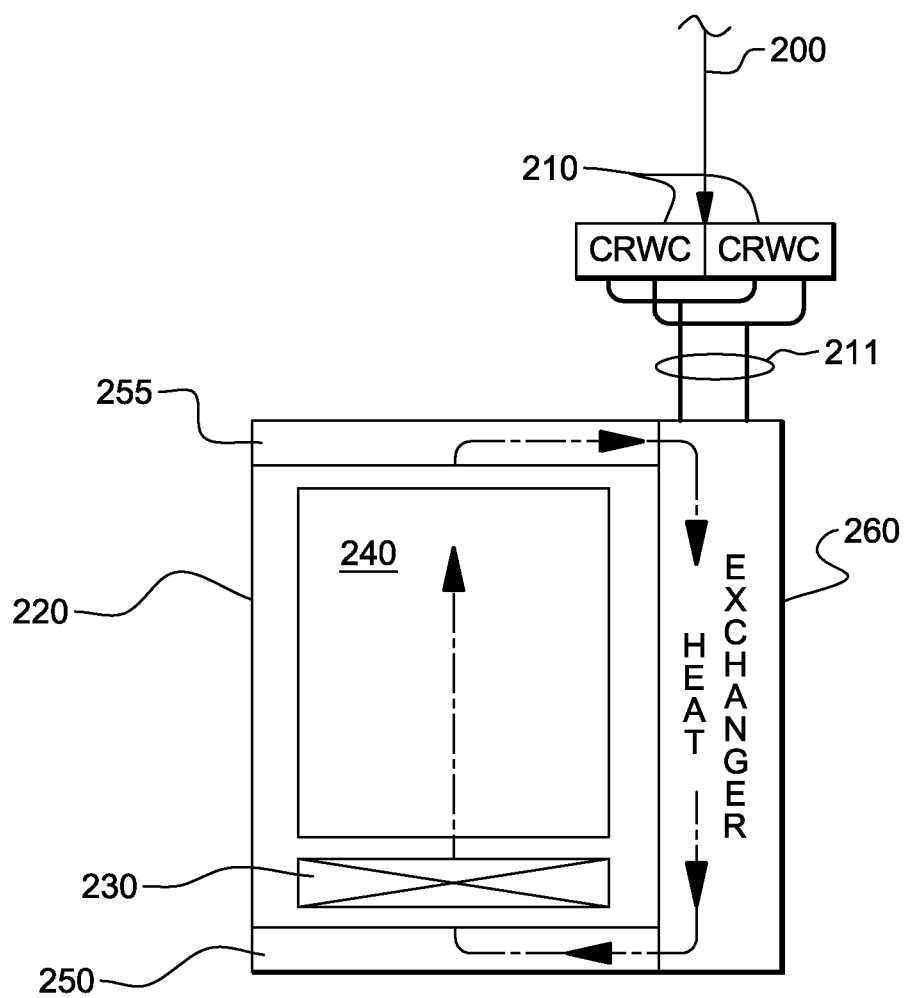
FIG. 2 is a cross-sectional plan view of one embodiment of an electronics rack with an attached air-to-liquid heat exchanger enhancing cooling of air passing through the electronics rack.
Figure 3:
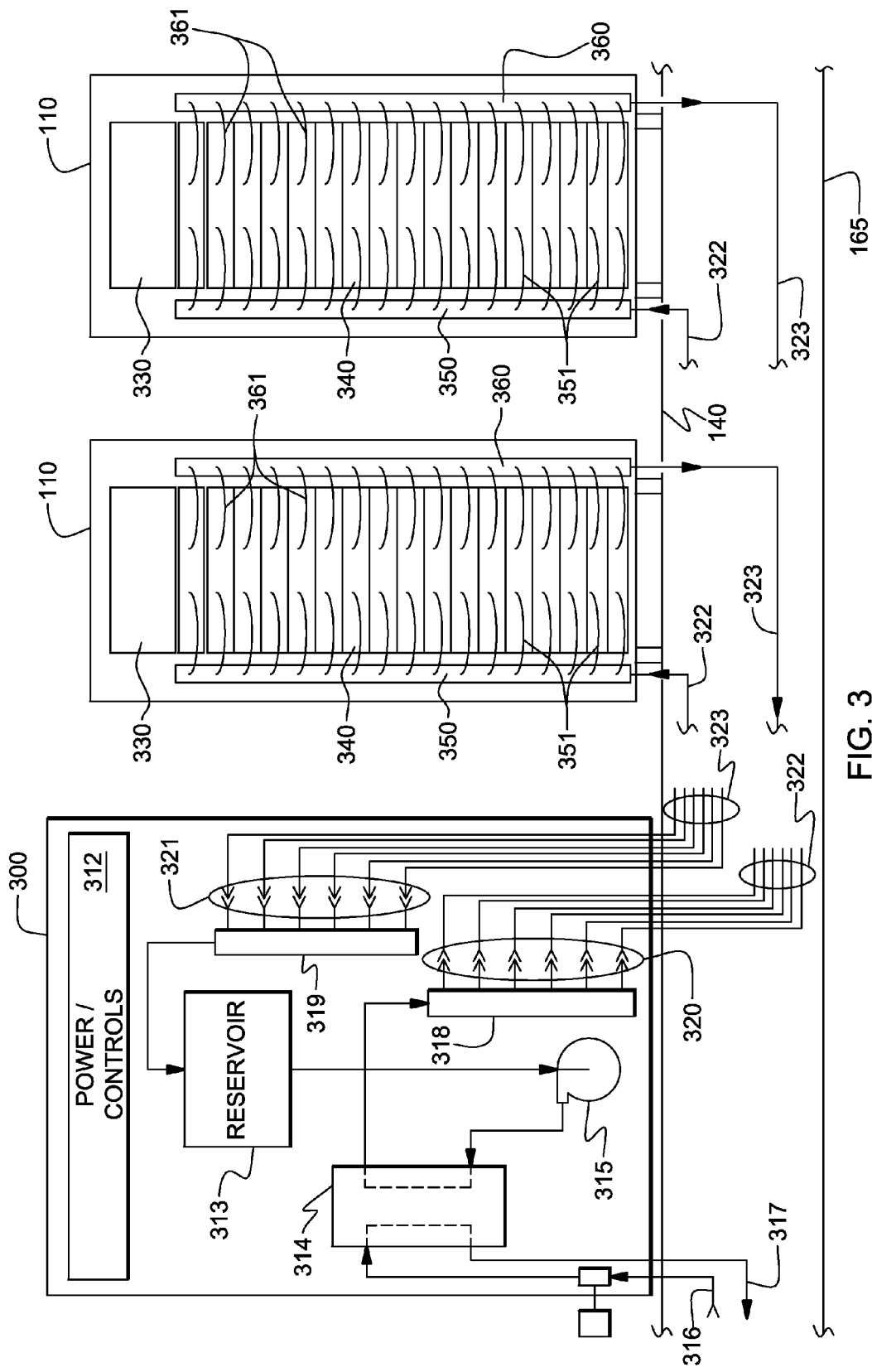
FIG. 3 depicts one embodiment of a data center with a coolant distribution unit facilitating liquid-cooling of one or more liquid-cooled electronics racks of the data center, in accordance with an aspect of the present invention.
Figure 4:
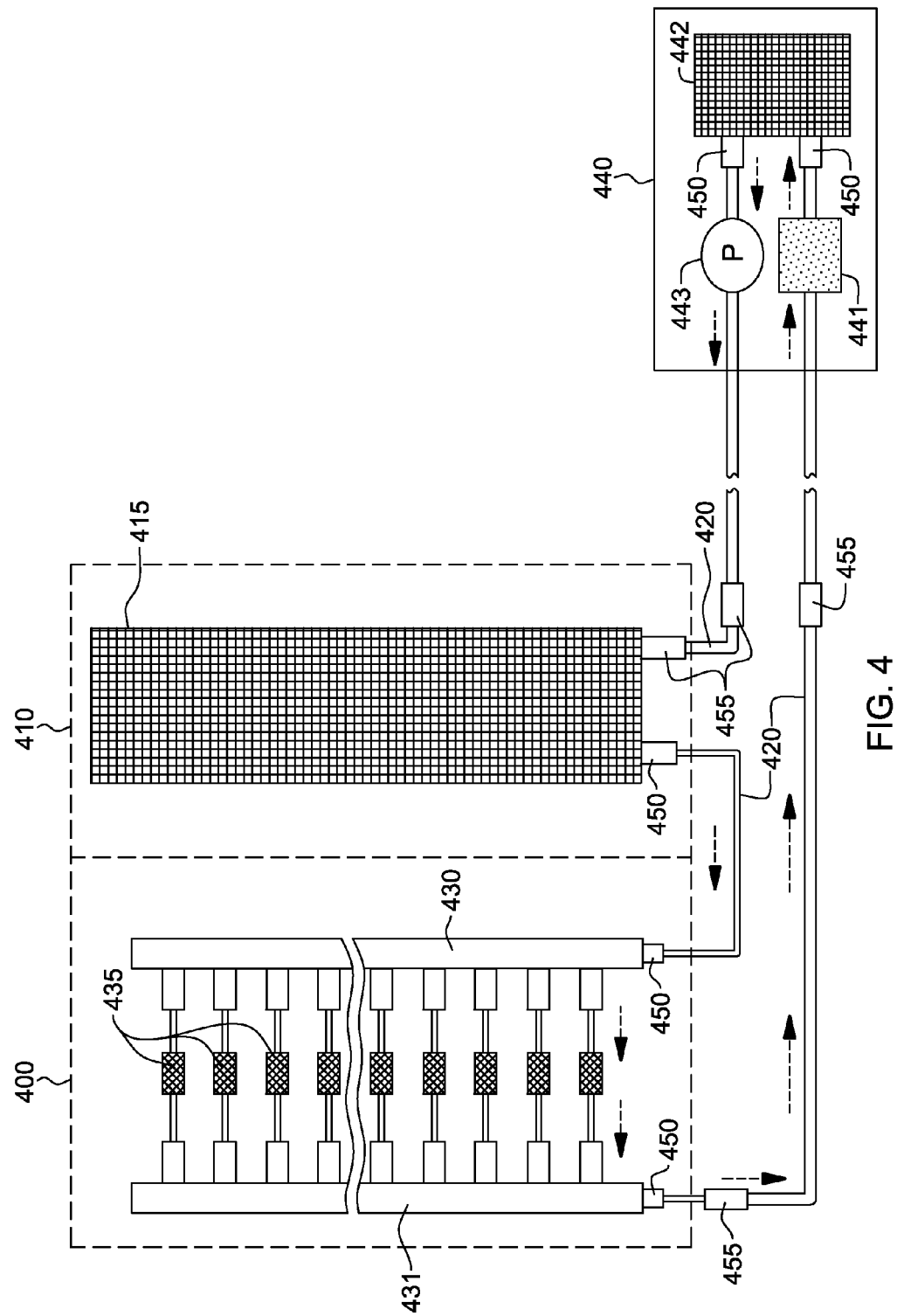
FIG. 4 depicts an alternate embodiment of a cooling apparatus and liquid-cooled electronics rack, in accordance with one or more aspects of the present invention.

Due to ever-increasing air flow requirements through electronics racks, and the limits of air distribution within a typical data center installation, liquid-based cooling is being combined with conventional air-cooling. FIGS. 2-4 illustrate various embodiments of a data center implementation employing a liquid-based cooling system.

FIG. 2 depicts one rack-level liquid-cooling solution which utilizes chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, liquid-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to liquid-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger, for example, disposed at an air outlet side thereof, which also receives system coolant from the system coolant supply manifold 350 and returns system coolant to the system coolant return manifold 360.

FIG. 4 illustrates another embodiment of a liquid-cooled electronics rack and cooling system therefor, in accordance with one or more aspects of the present invention. In this embodiment, the electronics rack 400 has a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-liquid heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating liquid coolant, a condenser (or air-to-liquid heat exchanger) 442 for removing heat from the liquid coolant, and a pump 443 for returning the liquid coolant through warm-liquid coolant loop 420 to air-to-liquid heat exchanger 415, and subsequently to the liquid-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic systems of the electronics rack, using liquid (e.g., water), that is cooled via circulation through the air-to-liquid heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the liquid coolant flowing through the liquid-cooled electronics rack, and associated air-to-liquid heat exchanger (if present), in a manner such as described above in connection with FIGS. 2 & 3.

Figure 5B:
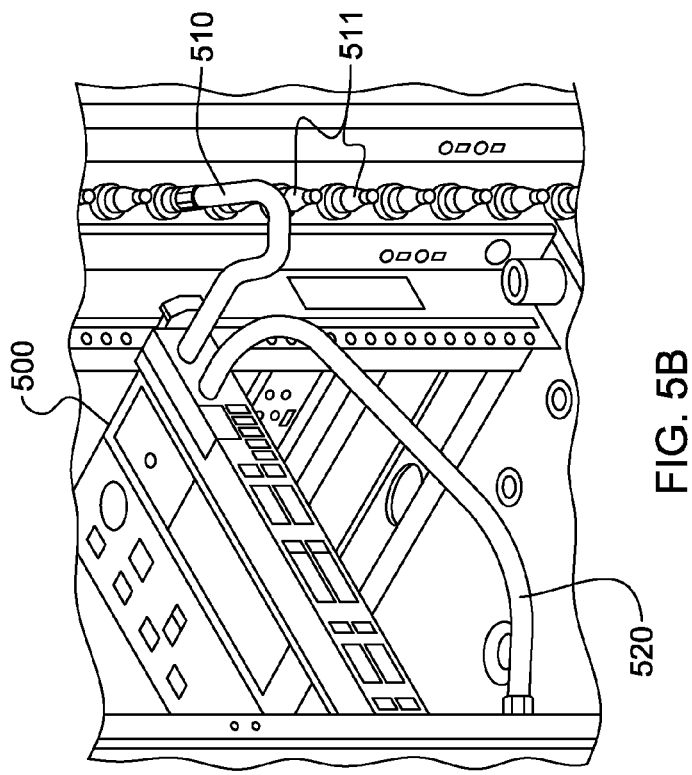
FIG. 5B is a partial depiction of a more detailed embodiment of the rack-level coolant distribution structures illustrated in FIG. 5A, in accordance with one or more aspects of the present invention.
Figure 5A:
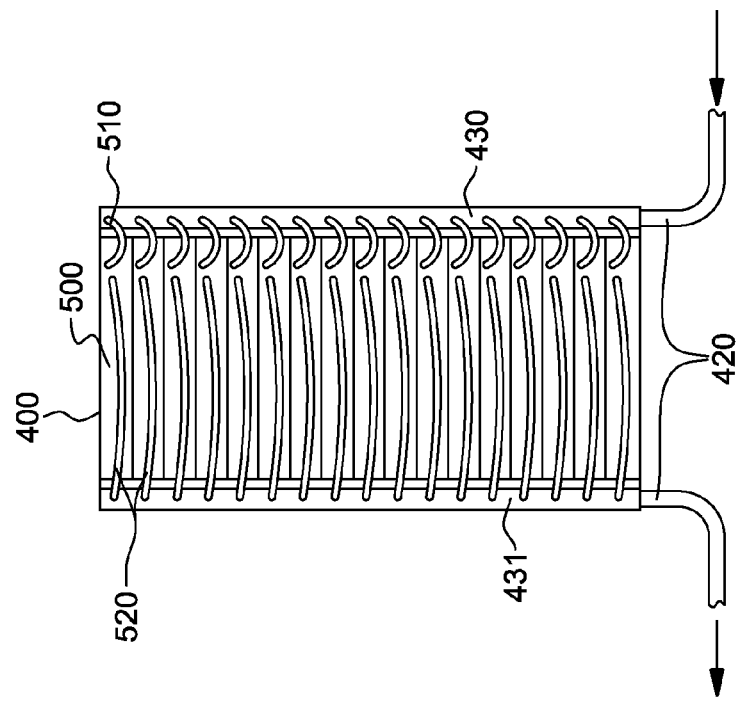
FIG. 5A is a more detailed, elevational view of one embodiment of the liquid-cooled electronics rack of FIG. 4, and illustrating rack-level coolant distribution structures, in accordance with one or more aspects of the present invention.

FIGS. 5A & 5B depict in greater detail one embodiment of a liquid-cooled electronics rack, such as depicted in FIG. 4, in accordance with one or more aspects of the present invention. In this implementation, liquid-cooled electronics rack 400 comprises a plurality of electronic systems 500, within which one or more electronic components are to be liquid-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to liquid-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be liquid-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm-liquid coolant, such as water, is supplied from the cooling unit, either directly, or through one or more air-to-liquid heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
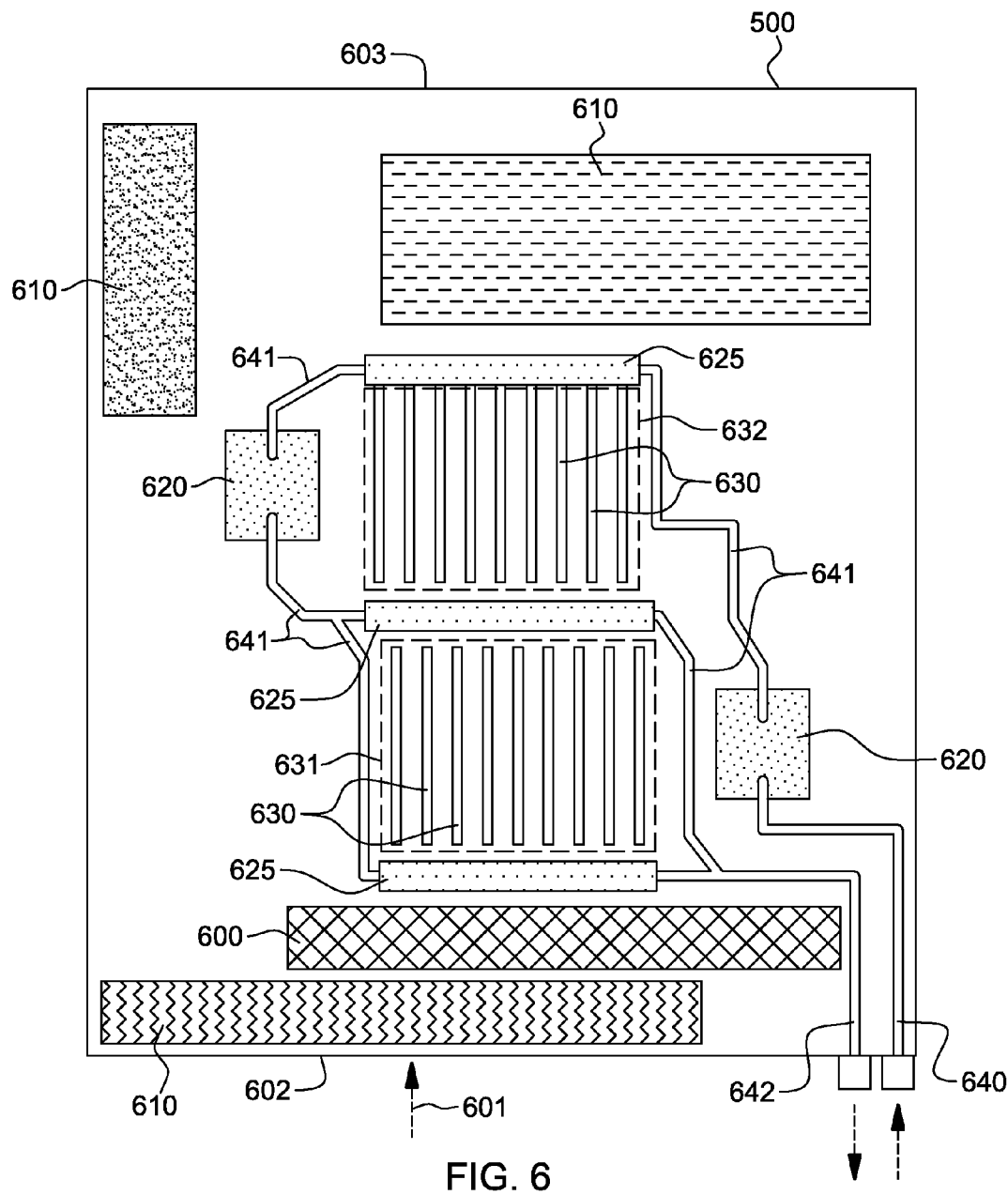
FIG. 6 is a plan view of one embodiment of an electronic system layout for a liquid-cooled electronics rack, and illustrating multiple liquid-cooled cold plates and multiple liquid-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which liquid-cooled cold plates 620 (of the liquid-based cooling apparatus) are coupled, as well as multiple arrays 631, 632 of electronics cards 630 (e.g., memory modules such as dual in-line memory modules (DIMMs)), which are to be thermally coupled to one or more liquid-cooled cold rails 625. As used herein "thermally coupled" refers to a physical thermal transport path being established between components, for example, between an electronics card and a liquid-cooled cold rail for the conduction of heat from one to the other.

The illustrated liquid-based cooling approach further includes multiple coolant-carrying tubes connecting in fluid communication liquid-cooled cold plates 620 and liquid-cooled cold rails 625. These coolant-carrying tubes comprise (for example), a coolant supply tube 640, multiple bridge tubes 641, and a coolant return tube 642. In the embodiment illustrated, bridge tubes 641 connect one liquid-cooled cold rail 625 in series between the two liquid-cooled cold plates 620, and connect in parallel two additional liquid-cooled cold rails 625 between the second liquid-cooled cold plate 620 and the coolant return tube 642. Note that this configuration is provided by way of example only. The concepts disclosed herein may be readily adapted to use with various configurations of cooled electronic system layouts. Note also, that as depicted herein, the liquid-cooled cold rails are elongate, thermally conductive structures comprising one or more channels through which liquid coolant passes, for example, via one or more tubes extending through the structures. The liquid-cooled cold rails are disposed, in the embodiment illustrated, at the ends of the two arrays (or banks) 631, 632 of electronics cards 630, and multiple thermal spreaders are provided coupling in thermal communication electronics cards 630 and liquid-cooled cold rails 625. Various such thermal spreaders are discussed below with reference to FIGS. 8A-19C.

Figure 7:
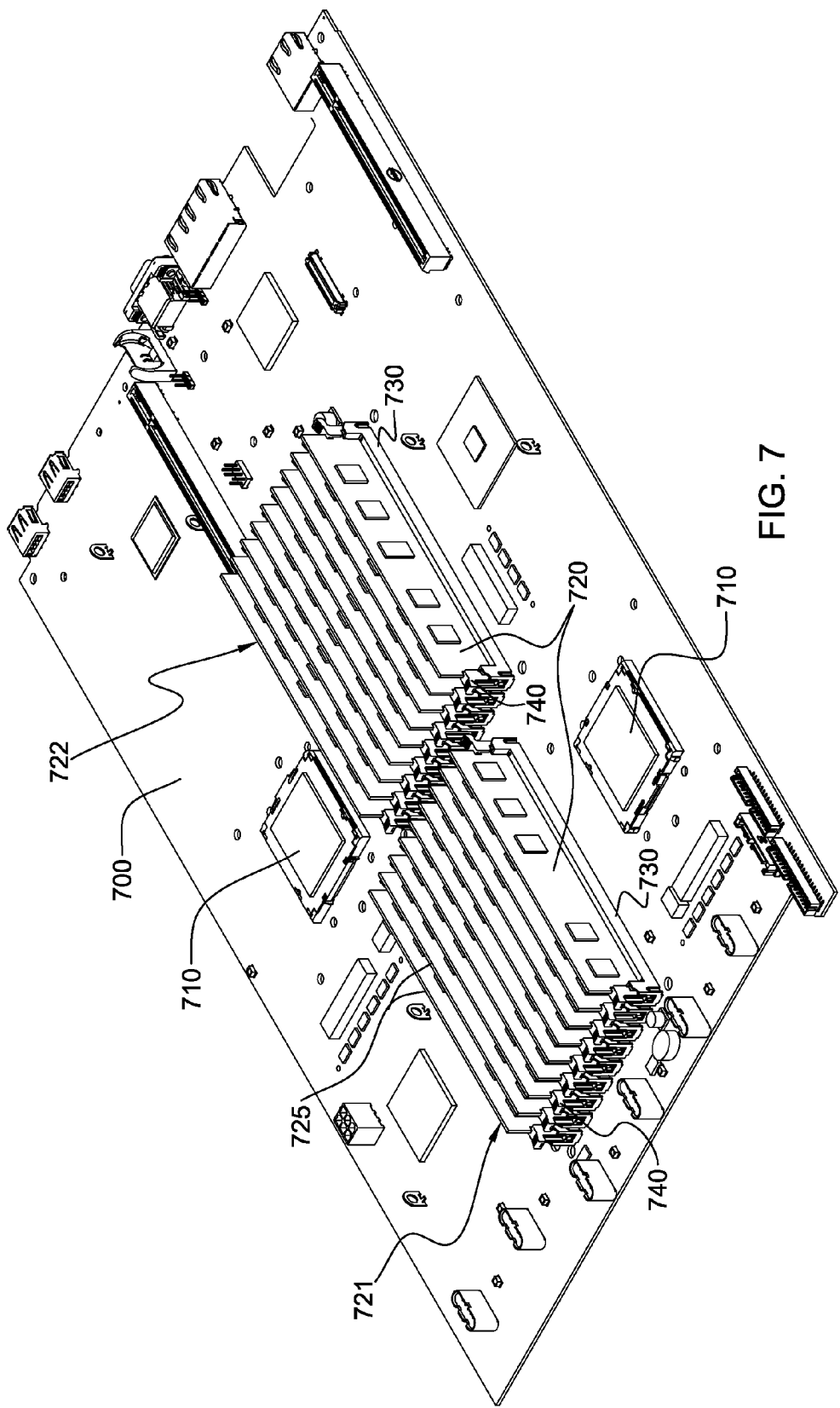
FIG. 7 depicts one detailed embodiment of a partially assembled electronic system, wherein the electronic system includes multiple different types of heat-generating electronic devices to be cooled, in accordance with one or more aspects of the present invention.
Figure 9A:
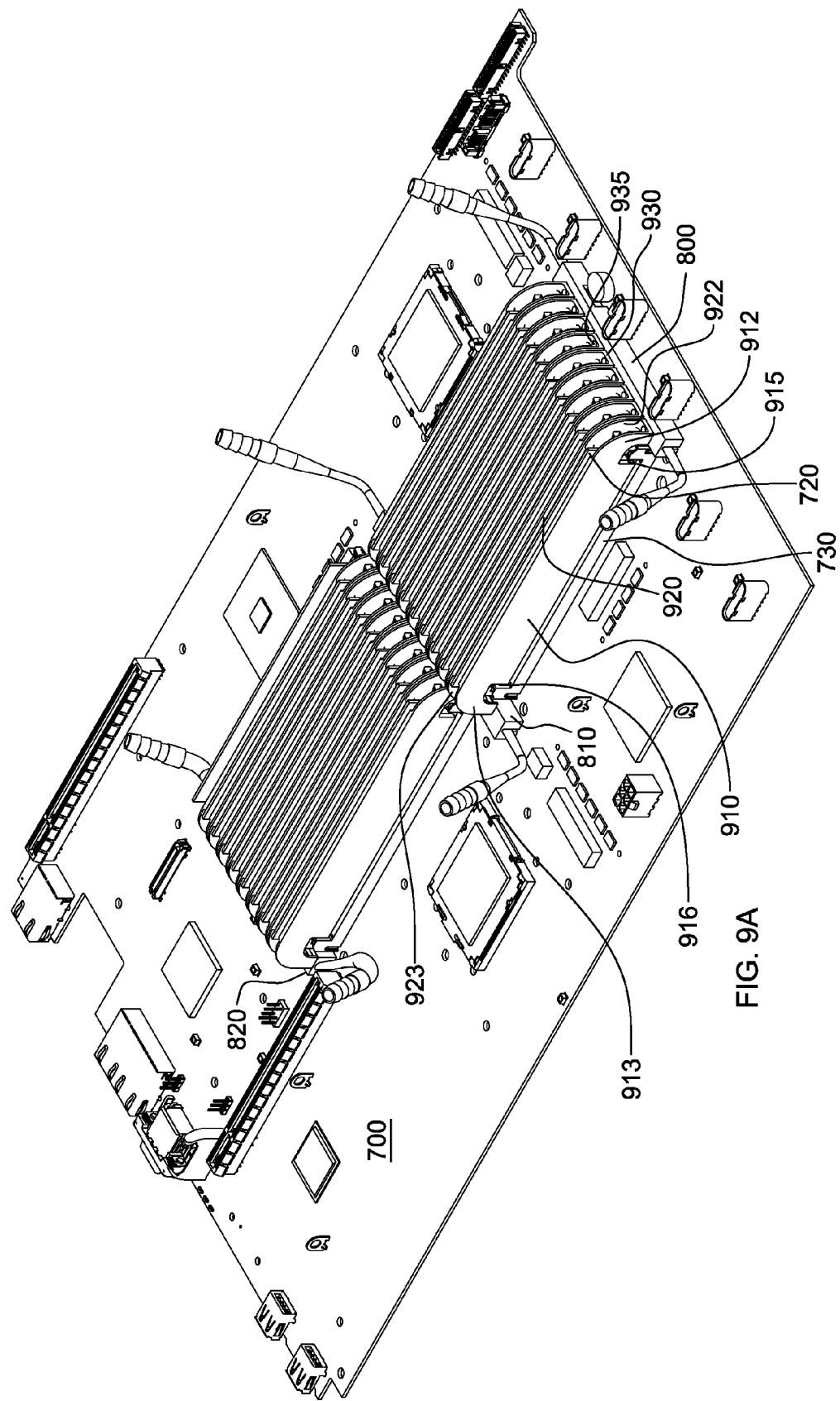
FIG. 9A depicts the partially assembled, cooled electronic system of FIGS. 8A-8D, with a plurality of thermal spreaders shown coupled to the electronics cards and thermally interfacing the electronics cards to respective liquid-cooled cold rails, in accordance with one or more aspects of the present invention.

FIG. 7 depicts in greater detail one embodiment of an electronic system layout comprising a printed circuit board 700 with two processor modules 710, each of which is to have a respective liquid-cooled cold plate of a liquid-based cooling system coupled thereto, and multiple arrays 721, 722 of electronics cards 720, such as memory cards comprising memory modules on opposite first and second sides thereof. Electronics cards 720 are held in respective sockets 730, mounted to printed circuit board 700, and latches 740 at the ends of sockets 730 facilitate securing (or removing) of electronics cards 720 within (or from) the respective sockets 730. The cooling apparatus embodiments described hereinbelow advantageously facilitate liquid-cooling of electronics cards 720 without interfering with an operator's access to latches 740 at the ends of sockets 730. In addition to existing component constraints on the surface of printed circuit board 700, there is assumed to be negligible space between a cover (not shown) of the electronic system (e.g., server), and the top edge surfaces 725 of electronics cards 720.

FIGS. 8A-8D depicts a partial assembly of a cooled electronic system comprising the electronic system layout of FIG. 7, including printed circuit board 700, processor modules 710, and arrays 721, 722 of electronics cards 720. Electronics cards 720 are each shown positioned within a respective socket 730 mounted to printed circuit board 700, with latches 740 being disposed at the opposite ends of each socket 730. Latches 740 facilitate securing (or removing) electronics cards 720 within (or from) the sockets.

FIGS. 8A-8D further depict multiple liquid-cooled cold rails 800, 810, 820, shown positioned at the ends of the elongate sockets 730 of the two arrays 721, 722 of electronics cards 720. Advantageously, these liquid-cooled cold rails are configured and positioned to not interfere with opening and closing of latches 740. The multiple cold rails include a first liquid-cooled cold rail 800, disposed at one end of sockets 730 in the first array 721 of electronics cards 720, a second liquid-cooled cold rail 810 disposed between the two arrays 721, 722 of electronics cards 720, and a third liquid-cooled cold rail 820 disposed at the other end of sockets 730 of the second array 722 of electronics cards 720. Holes 830 are provided within each of the cold rails. In one embodiment, these holes may comprise threaded holes in the cold rails which facilitate attachment of the thermal spreaders (not shown) to the respective cold rails, as described further below.

In FIG. 8B, first liquid-cooled cold rail 800 is illustrated in greater detail at the one end of the sockets 730 of the first array 721 of electronics cards 720. As noted above, each cold rail is a thermally conductive structure with at least one coolant-carrying channel extending therein. In this example, the coolant-carrying channel is a flattened tube 801 that is vertically-oriented within the cold rail and offset from holes 830. As shown, first liquid-cooled cold rail 800 is sized (in this example) to fit between sockets 730, and one or more fan sockets 805. In addition, the cold rail may be selectively recessed at its bottom surface and/or one or more side surfaces to clear any interfering components, such as capacitors or chips, on the printed circuit board. The flattened tube 801 extending through the thermally conductive structure of the cold rail may comprise (as one example) a flattened ⅛ inch pipe, which may be routed above any intrusive elements on the board. In the example illustrated, quick disconnects 802 (FIG. 8A) are shown provided at the ends of flattened tube 801.

In FIG. 8C, second liquid-cooled cold rail 810 is illustrated in greater detail. This cold rail is configured and sized to fit between the two arrays 721, 722 of electronics cards. Two rows of holes 830 are provided within second liquid-cooled cold rail 810 to facilitate coupling of thermal spreaders from the different arrays to the cold rail. In order to clear the holes in the cold rail, a vertically-oriented, flattened pipe 811 passing through cold rail 810 is positioned within a slot 813 cut in the middle of the cold rail, for example, from the lower surface of the cold rail into the thermally conductive structure. By way of example, flattened tube 811 may be a flattened ⅛ inch pipe. Quick disconnect couplings 802 may also be provided for connecting flattened tube 811 in fluid communication with other coolant-carrying tubes, such as the bridging tubes described above in connection with FIG. 6.

FIG. 8D illustrates in greater detail one embodiment of third liquid-cooled cold rail 820 disposed at the other end of the second array 722 of electronics cards 720. As illustrated, third liquid-cooled cold rail 820 is positioned to not interfere with opening or closing of latches 740 at the other end of sockets 720 in the second array 722. The cold rail includes a series of holes 830, which will facilitate coupling thermal spreaders (not shown) to the cold rail, and accommodates a flattened tube 821, which is vertically aligned within an appropriately-sized slot 823 in the thermally conductive structure of the cold rail and is offset from the series of holes 830. This cold rail may again be selectively recessed at its lower surface and/or side surfaces to clear any interfering components on printed circuit board 700.

In the example of FIG. 8D, and assuming the cooling implementation depicted in FIG. 6, the tube through which water flows may be a flattened, ¼ inch pipe, routed away from any intrusive elements on the printed circuit board. As illustrated in FIG. 8A, quick disconnect couplings 802 may be provided at the ends of flattened tube 820 to facilitate coupling of the tube in fluid communication with other tubes of the liquid-based cooling approach discussed above in connection with FIG. 6. As illustrated in FIGS. 8A-8D, each liquid-cooled cold rail 800, 810, 820 may be unique in terms of its location on the circuit board, and uniquely configured due to existing constraints within the different areas of the printed circuit board. These liquid-cooled cold rails are, in one embodiment, coupled to either a cold liquid cooling loop or a warm-liquid cooling loop, depending on the cooling approach desired, as described above.

FIGS. 9A-9D depict one embodiment of a cooled electronic system comprising the electronic subassembly of FIGS. 8A-8D, with a plurality of thermal spreaders shown positioned between and in physical and thermal contact with the electronics cards of the arrays (or banks) of electronics cards. These thermal spreaders provide a thermal coupling or thermal conduction path from the electronics cards, for example, the memory modules on the opposite sides of the electronics cards, to the liquid-cooled cold rails to facilitate cooling of the electronics cards via conductive heat transfer to the cold rails, and hence to the liquid flowing through the cold rails.

In the embodiment illustrated, each thermal spreader comprises a first thermal transfer plate 910 and a second thermal transfer plate 920. The first thermal transfer plate comprises a first thermal conduction surface, and the second thermal transfer plate 920 comprises a second thermal conduction surface. The first thermal conduction surface and the second thermal conduction surface are in spaced, opposing relation, and are configured to accommodate a respective electronics card 720 therebetween, with the first thermal conduction surface physically and thermally coupled to at least one first surface on one side of the electronics card 720, and the second thermal conduction surface physically and thermally coupled to at least one second surface on the other side of the electronics card 720. These first and second surfaces on the different sides of the electronics card may comprise, in one example, surfaces of one or more electronics devices, such as memory modules, mounted on the different sides of the respective electronics card.

Further, the first thermal transfer plate 910 and second thermal transfer plate 920 each comprise a first end edge 915, and a second end edge 916, disposed at opposite ends of the respective socket 730. Each thermal transfer plate is a thermally conductive structure formed (in one example) as an elongate, flat plate. In this example, thermally conductive extensions 912, 922 and 913, 923 are provided extending from the first and second end edges 915, 916 of each thermal transfer plate 910, 920.

In one embodiment, these extensions 912, 922 and 913, 923 are curved extensions, which may be characterized, in one embodiment, as "elephant trunk-shaped extensions". In particular, a first thermally conductive extension 912 is a curved extension which extends from and upper portion of first thermal transfer plate 910 at the first end edge thereof 915, and a similar, second thermally conductive extension 922 extends from the first end edge 915 of second thermal transfer plate 920. In addition, a third thermally conductive extension 913 extends from the second end edge 916 of first thermal transfer plate 910, and a fourth thermally conductive extension 923 extends from the second end edge 916 of second thermal transfer plate 920. The thermally conductive extensions 912, 922 at the first end edge 915 of the first and second thermal transfer plates 910, 920 are spaced apart to allow access to the respective socket latch at the end of the socket 730 containing the electronics card 720 sandwiched by the plates of the thermal spreader. Similarly, the thermally conductive extensions 913, 923 at the second end edges 916 of the first and second thermal transfer plates 910, 920 are spaced apart to allow access to the latch disposed at the other end of the socket. In this embodiment, the extensions 912, 922 and 913, 923 are joined at their ends, and connected to the respective cold rail by respective connecting flanges 930, each of which includes an opening 935, aligned to an underlying opening 830 in the adjacent cold rail 800, 810, 820. FIGS. 9B-9D illustrate these structures in greater detail, with the thermal spreaders shown ready to be fastened to the respective cold rails using, for example, a threaded fastener.

As explained above, heat is transferred from the heat-generating components of the electronics card (for example, memory modules) to the conduction surfaces of the thermal transfer plates, across the thermal transfer plates to the thermally conductive extensions at the ends thereof, and from the thermally conductive extensions into the respective liquid-cooled cold rails. From the liquid-cooled cold rails, the heat is rejected to coolant flowing through the channels or tubes extending through the cold rails, and subsequently, is removed from the cooled electronic system in a manner such as, for example, explained above in connection with FIGS. 4-6.

Note that in the embodiment depicted in FIGS. 9A-9D, the connecting flanges 930 at the ends of the thermally conductive extensions (where contacting the respective cold rails), are solid connecting structures, meaning that the thermal spreaders are (in one embodiment) single-piece structures. Also, note that, in the approach depicted, heat is conducted by the thermal transfer plates to each end edge of the plates, and in particular, to the thermally conductive extensions extending from the respective end edges to the two cold rails disposed at the opposite ends of the respective sockets in an array (or bank) of electronics cards. These thermally conductive extensions and connecting flanges physically and thermally couple to the upper surface of the respective cold rails. As illustrated in the plan views of FIGS. 9B-9D, the latches for the respective sockets remain accessible by appropriately spacing each pair of thermally conductive extensions to the first and second sides of the latches at issue. This can be accomplished, in part, by reducing the thickness of the extensions compared with the thickness of the plates, as shown in the plan views of FIGS. 9B-9D.

FIGS. 10A-17D depict various enhancements to the cooling apparatus approaches described above, and in particular, various enhancements to cooling apparatuses comprising liquid-cooled structures or cold plates for cooling one or more heat-generating components (such as one or more processor modules).

FIG. 10A depicts a cross-sectional view of one embodiment of a liquid-cooled cold plate 1000. As shown, liquid-cooled cold plate 1000 comprises a thermally conductive structure 1010 with a plurality of micro-channels 1020 provided therein, through which coolant flows for extracting heat, for example, from one or more heat-generating components (not shown) coupled to the cold plate. Coolant is received into the micro-channels via a coolant inlet port 1022 and exhausted via a coolant outlet port 1024, both of which are in fluid communication with micro-channels 1020. Providing a cold plate with a plurality of micro-channels 1020 facilitates thermal transfer to the coolant flowing through the structure, but is difficult and expensive to manufacture due to constraints associated with forming the micro-channels (which are very small coolant flow passageways, for example, on the order of 0.5 mm). For example, one approach for fabricating the liquid-cooled cold plate 1000 of FIG. 10A with a plurality of micro-channels is to employed skiving/wire EDM/impact extrusion processing, along with vacuum brazing, which can be a difficult and expensive manufacturing approach. Hence, the liquid-cooled structure of FIG. 10A might not be a cost effective cooling solution. Also, in view of the manufacturing constraints, liquid-cooled cold plate 1000 of FIG. 10A would typically be manufactured with a similar footprint to the particular surface to be cooled of the electronic component, which means that using the cold plate depicted in FIG. 10A, different electronic components to be liquid-cooled would probably require different, specially-configured and sized cold plates.

In FIG. 10B, a different type of liquid-cooled structure or cold plate 1050 is depicted, wherein a plurality of coolant-carrying tubes 1070 are disposed within channels in a thermally conductive structure 1060, which might comprise an aluminum or copper block (or plate). By way of example, coolant-carrying tubes 1070 may have an outer diameter in the range of 4.5 mm-6.35 mm, and be manufactured by bending tubes to the desired configuration and mechanically attaching the tubes to channels in a plate using, for example, thermal epoxy.

In the embodiment illustrated, coolant-carrying tubes 1070 are in fluid communication with a coolant inlet plenum 1072 and a coolant outlet plenum 1074. Coolant flows via a coolant inlet port 1073 to coolant inlet plenum 1072 for passage through the plurality of coolant-carrying tubes 1070, and heated coolant is exhausted via coolant outlet plenum 1074 through a coolant outlet port 1075. In the example of FIG. 10B, liquid-cooled cold plate 1050 is shown to have a substantially larger footprint than that of the electronic component 1051 to be cooled. Specifically, in the embodiment illustrated, the thermal conduction surface of the cold plate which couples to the surface to be cooled of the electronic component has a larger surface area than that of the surface to be cooled. Thus, in this implementation, the liquid-cooled cold plate and coolant-carrying tubes may be larger structures than the corresponding structures of the micro-channel cold plate of FIG. 10A, and therefore the implementation of FIG. 10B is more straightforward and cost effective to manufacture. However, due to its size, thermal transfer performance to coolant flowing through the liquid-cooled cold plate 1050 of FIG. 10B might be lower than thermal transfer performance to coolant flowing through a liquid-cooled structure such as depicted in FIG. 10A.

Figure 11A:
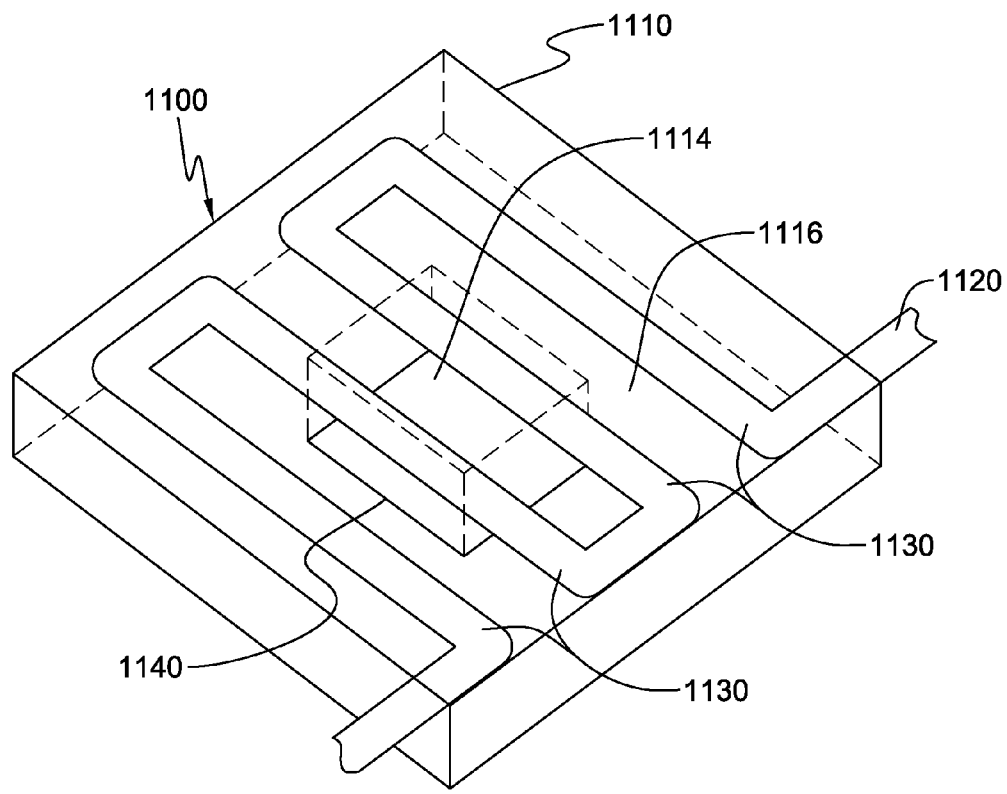
FIG. 11A depicts an alternate embodiment of a cooling apparatus comprising a liquid-cooled cold plate including one or more coolant-carrying tubes embedded within the thermally conductive material of the cold plate, and shown coupled to an electronic component for cooling the electronic component, in accordance with one or more aspects of the present invention.
Figure 11B:
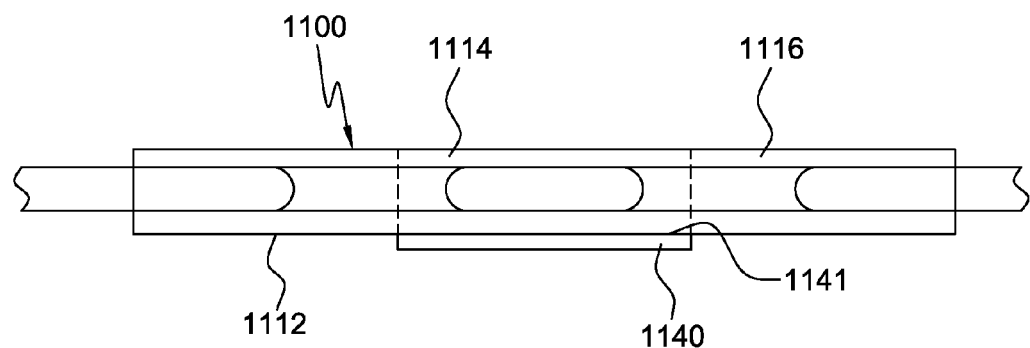
FIG. 11B is an elevational view of the liquid-cooled cold plate and electronic component of FIG. 11A, in accordance with one or more aspects of the present invention.

FIGS. 11A & 11B collectively illustrate another embodiment of a cooling apparatus comprising a liquid-cooled structure or cold plate 1100 fabricated of a thermally conductive structure 1110 and having one or more coolant-carrying tubes 1120 extending within or through the thermally conductive structure. In this implementation, a single coolant-carrying tube 1020 is illustrated, which is bent into a sinusoidal shape within the thermally conductive structure 1110. Coolant-carrying tube 1120 is shown to comprise a plurality of coolant-carrying tube (or channel) sections 1130, which (in the embodiment of FIG. 11A) are disposed substantially parallel to and spaced from each other within the thermally conductive structure 1110. Liquid-cooled cold plate 1100 is shown coupled to an electronic component 1140 to be cooled. In particular, a thermal conduction surface 1112 of liquid-cooled cold plate 1100 is coupled to a surface 1141 to be cooled of electronic component 1140, meaning that the surface to be cooled of the electronic component is in opposing relation to a portion of thermal conduction surface 1112 of liquid-cooled cold plate 1110. Thermal conduction from the electronic component to the cold plate can be facilitated by providing a thermal grease, thermally conductive pad, or other interstitial thermally conductive layer between the thermal conduction surface 1112 and the surface to be cooled 1141. Projecting into the cold plate where the surface 1141 to be cooled aligns to the cold plate defines a first region 1114 of the cold plate and a second region 1116 of the cold plate, which is that region of the cold plate outside the first region. In first region 1114, heat is directly transferred via conduction upwards (in this example), from the surface 1141 to be cooled into the cold plate 1100. In contrast, to reach the second region, heat must radiate outwards laterally once in the thermally conductive material of the cold plate in order to reach coolant-carrying tube sections 1130 in the second region 1116. Therefore, in this implementation, coolant-carrying tube sections 1130 in second region 1116 of liquid-cooled cold plate 1100 individually provide reduced heat transport to coolant compared with a coolant-carrying tube section 1130 within first region 1114 of the liquid-cooled cold plate 1100.

Addressing this issue, presented herein are various cooling apparatuses which comprise liquid-cooled cold plates (such as described above in connection with FIGS. 11A & 11B) with associated thermal spreaders comprising embedded heat pipes (or vapor chambers). These cooling apparatuses are particularly beneficial in combination with the liquid-cooling approaches described herein, such as the warm-liquid-cooling approach described above with reference to FIGS. 4-9D.

Generally stated, the cooling apparatuses disclosed herein facilitate dissipating heat from an electronic component of an electronic system. In one example, the electronic component comprises an integrated circuit, such as a processor. The cooling apparatus includes a liquid-cooled cold plate, which comprises a thermally conductive material having a plurality of coolant-carrying channel sections extending therein. The liquid-cooled cold plate includes a thermal conduction surface comprising a first surface area (with the electronic component comprising a surface to be cooled having a second surface area), and the first surface area of the thermal conduction surface being greater than the second surface area of the surface to be cooled. In operation, heat is transferred from the surface to be cooled of the electronic component to the thermal conduction surface of the liquid-cooled cold plate, and the liquid-cooled cold plate includes a first region where the surface to be cooled aligns to (for example, is disposed in opposing relation to) the cold plate, and a second region disposed outside the first region. Advantageously, a thermal spreader is associated with the liquid-cooled cold plate, and includes at least one heat pipe. The at least one heat pipe comprises multiple heat pipe sections, with at least one heat pipe section of the multiple heat pipe sections being at least partially aligned to the first region of the liquid-cooled cold plate, and partially aligned to the second region of the liquid-cooled cold plate. In operation, the heat pipe(s) of the thermal spreader facilitate distribution of heat from the electronic component to coolant-carrying channel sections of the liquid-cooled cold plate disposed, for example, in the second region of the liquid-cooled cold plate, and therefore enhance thermal transfer to coolant flowing through the cold plate.

Advantageously, in the cooling apparatuses disclosed herein, the liquid-cooled cold plate includes at least one coolant-carrying tube embedded within a thermally conductive structure, with the at least one coolant-carrying tube comprising the plurality of coolant-carrying channel sections. As a further enhancement, the thermal spreader and the liquid-cooled cold plate may be integrated into a common, thermally conductive structure (that is, a common, monolithic structure). Alternatively, the thermal spreader may be a discrete structure that is detachably coupled to the liquid-cooled cold plate, and (in one embodiment) detachably coupled to the electronic component. Examples of these two approaches are illustrated in FIGS. 12A & 12B.

Figure 12A:
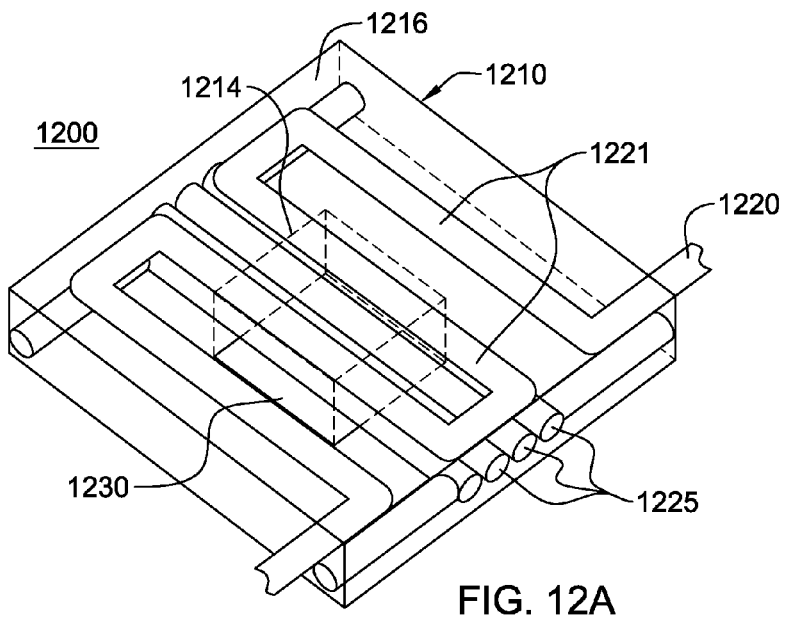
FIG. 12A depicts one embodiment of a cooling apparatus comprising a liquid-cooled cold plate and thermal spreader embedded within a common, thermally conductive structure, and shown coupled to an electronic component to be cooled, in accordance with one or more aspects of the present invention.

In FIG. 12A, an integrated cooling apparatus 1200 is illustrated comprising a common, thermally conductive structure 1210 which houses a liquid-cooled cold plate comprising at least one coolant-carrying tube 1220 embedded within the common, thermally conductive structure 1210, and a thermal spreader comprising multiple heat pipe sections 1225. As in the embodiment described above in connection with FIG. 11A, the coolant-carrying tube is a sinusoidal-shaped tube, which has multiple coolant-carrying channel sections 1221 disposed in parallel within the common, thermally conductive structure 1210. Further, as noted above, a projection into thermally conductive structure 1210 where electronic component 1230 aligns to the thermally conductive structure, defines a first region 1214 of thermally conductive structure 1210, and a second region 1216 of the thermally conductive structure, which is that region of the structure outside of the first region 1214. Advantageously, multiple heat pipe sections 1225 are disposed between the coolant-carrying tube(s) and the electronic component, and partially align to first region 1214 of the thermally conductive structure 1210, and extend into the second region 1216 of the thermally conductive structure. These multiple heat pipe sections 1225 facilitate lateral distribution of heat within the common, thermally conductive structure, thereby facilitating conduction of heat from the electronic component to coolant-carrying channel sections 1221 of the liquid-cooled cold plate disposed in the second region of the thermally conductive structure 1210.

Figure 12B:
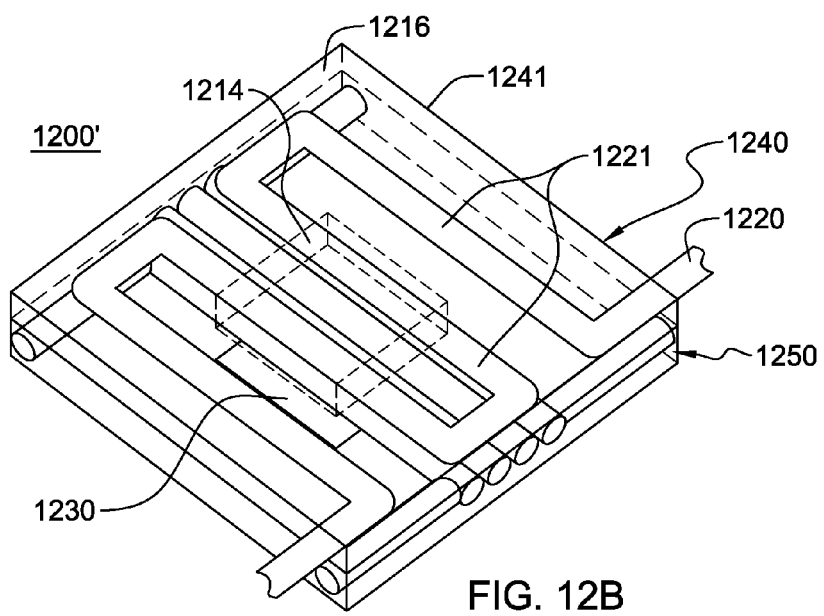
FIG. 12B depicts an alternate embodiment of a cooling apparatus comprising a liquid-cooled cold plate and a thermal spreader, with the cooling apparatus shown coupled to an electronic component to be cooled, in accordance with one or more aspects of the present invention.
Figure 12C:
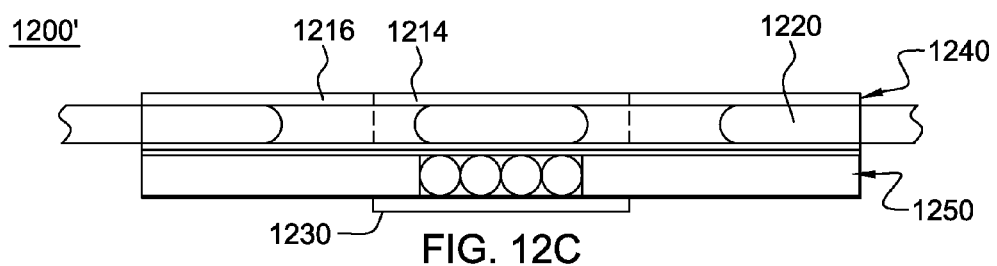
FIG. 12C is an elevational view of the cooling apparatus of FIG. 12B, in accordance with one or more aspects of the present invention.

FIGS. 12B & 12C depict a substantially identical cooling apparatus 1200' to that described above in connection with FIG. 12A. One difference, however, is that the liquid-cooled cold plate 1240 and thermal spreader 1250 are fabricated as discrete components (e.g., plates) which are detachably coupled to each other, with thermal spreader 1250 residing between liquid-cooled cold plate 1240 and electronic component 1230 to be cooled. Thermal conduction from electronic component 1230 to thermal spreader 1250, and from thermal spreader 1250 to liquid-cooled cold plate 1240, can be facilitated by providing a thermal grease, thermally conductive pad, or other interstitial thermally conductive layer between the respective opposing surfaces.

As explained, liquid-cooled cold plate 1240 includes one or more coolant-carrying tubes 1220, which in this example, comprise a single coolant-carrying tube 1220 extending in a sinusoidal manner within the thermally conductive structure 1241 of liquid-cooled cold plate 1240. Projecting where electronic component 1230 aligns to the liquid-cooled cold plate defines a first region 1214 and a second region 1216 of the cold plate, wherein one or more coolant-carrying channel sections 1221 may be disposed only in the second region of the liquid-cooled cold plate.

Thermal spreader 1250 comprises a thermally conductive structure within which multiple heat pipe sections 1225 are disposed, as described above in connection with the implementation of FIG. 12A. By way of example, these multiple heat pipe sections 1225 comprise multiple straight heat pipe sections positioned, at least in part, parallel and physically contacting each other lengthwise in the region between the electronic component and the liquid-cooled cold plate. These straight heat pipe sections 1225 align at least partially to the first region 1214 of liquid-cooled cold plate and extend into the second region 1216 of the cold plate to facilitate lateral spreading of heat from the electronic component into the second region of the liquid-cooled cold plate, and thereby facilitate thermal transfer to coolant flowing through coolant-carrying channel sections 1221 located in second region 1216 of liquid-cooled cold plate 1240. Note that in an alternate embodiment, the entire thermal spreader could be a wall of straight heat pipe sections disposed parallel and physically contacting along their lengths throughout the entire thermal spreader.

Note also that there are a number of advantages to the cooling apparatus designs depicted in FIGS. 12A-12C. For example, one problem solved by these cooling apparatuses is the manufacturability of the cold plates. For a cold plate with a micro-channel design, such as illustrated in FIG. 10A, manufacturing is often cost-prohibitive (for example, because the cold plate would typically need to be vacuum-brazed). In contrast, in a cooling apparatus embodiment such as proposed herein employing a thermal spreader (with embedded heat pipes), the larger, coolant-carrying tubes can be readily soldered into an appropriately configured cold plate (with the soldering enhancing heat transfer from the cold plate to coolant flowing through the tubes). This approach is a more cost effective manufacturing approach in comparison to the micro-channel approach described above.

Note further that as used herein, a "heat pipe" (or vapor chamber) comprises (for example) a hollow structure that allows heat to migrate from one end of the structure to another end via a flow of vapor. The heat pipe provides a return of liquid condensate under the action of capillary force via a wick or screen-like matrix. A high concentration of vapor may exist closer to the heat source, with a lower concentration of vapor at the condenser end(s) of the heat pipe. The result is a mass flow from one end to the other end of the member, taking advantage of the latent thermal capacity of the vapor to carry heat from one end to the other. In one implementation, a thermal spreader with multiple heat pipes or multiple heat pipe sections may be fabricated by drilling appropriately-sized holes in a block of thermally conductive material, such as copper or aluminum, after which cylindrical-shaped heat pipes may be inserted. Note, however, that various other thermal spreader configurations utilizing heat pipes may be employed.

Figure 13:
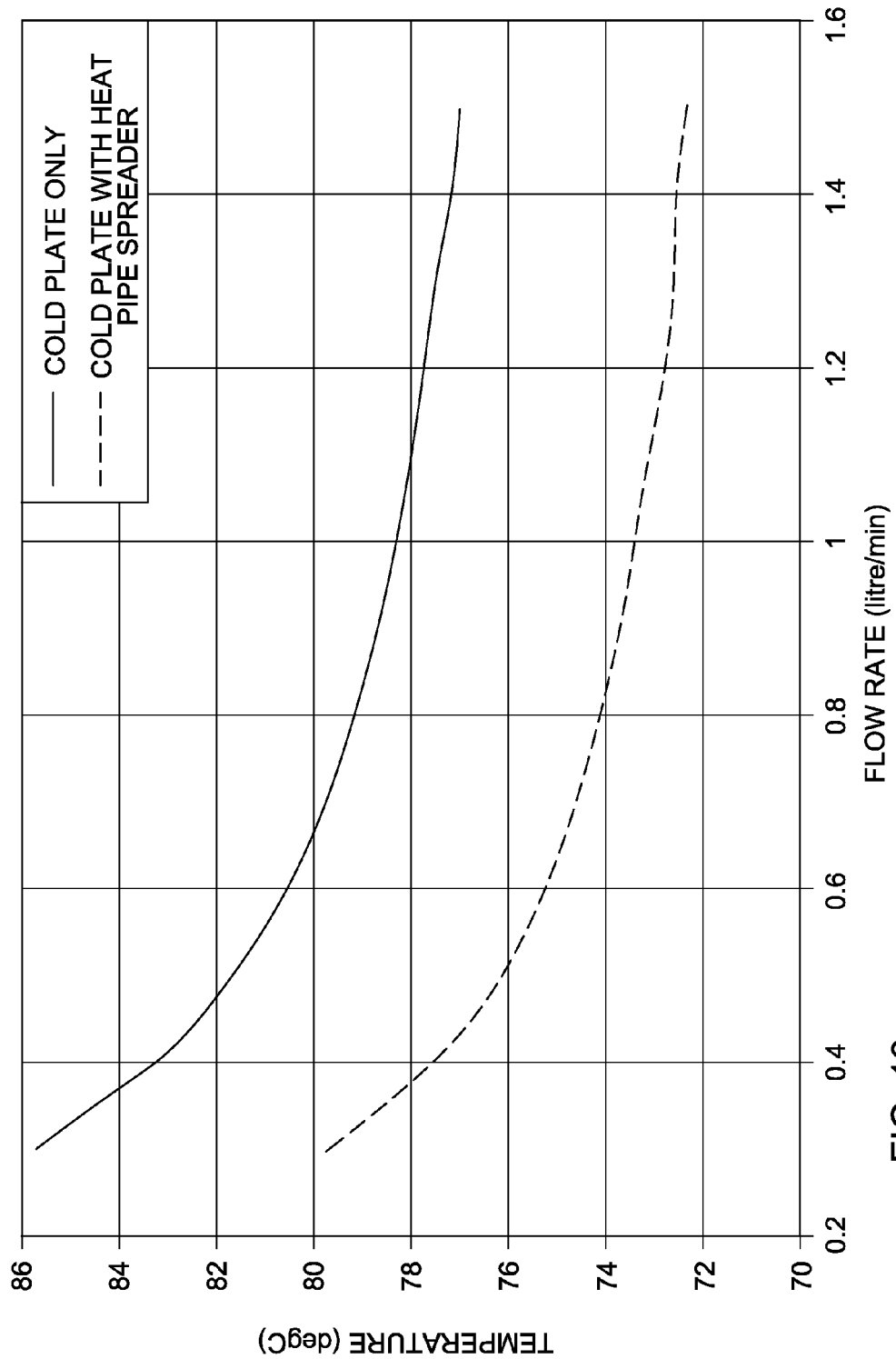
FIG. 13 is a graph of thermal modeling results for a cooling apparatus comprising a liquid-cooled cold plate without a thermal spreader in comparison to a cooling apparatus comprising a liquid-cooled cold plate with an associated thermal spreader such as described herein, in accordance with one or more aspects of the present invention.

In FIG. 13, thermal modeling results are depicted comparing (within the context of a warm-liquid-cooling approach) a cold plate with a thermal spreader (that is either detachable or embedded within the cold plate), versus a cold plate without such a thermal spreader. The thermal performance of two such cold plates is charted for a range of flow rates of coolant (with water being used for comparison) to cool, by way of example, a 130 Watt electronic component. The temperature of the electronic component was monitored at the center of the component, and as shown, the cold plate with the thermal spreader (having embedded heat pipes) outperforms the cold plate without the thermal spreader, with the performance gain being approximately 0.05° C./W.

As explained further below, another advantage of the cooling apparatuses disclosed herein is that a single cold plate design can be used to accommodate different power maps without changing the design of the cold plate. For example, a cold plate designed for a six-core integrated circuit chip could also be used for a dual core chip with higher frequency, even though the power maps may be different. The cooling apparatuses disclosed herein can also accommodate different package sizes, and different heat fluxes. For instance, the same cold plate design could be used for multiple generations of CPUs, even though lid sizes on the chips are different. Thus, the cooling apparatuses disclosed herein enable a single cold plate design to be employed with different footprint sizes that can be used across multiple platforms, which makes use of the cooling apparatus straightforward. The designs presented herein also allow greater flexibility for locating the cold plate on the electronic component. That is, the electronic component need not be centered on the cold plate, and can be independent of the coolant loop to the cold plate, which is not recommended for a cold plate without a thermal spreader such as disclosed herein due to thermal performance loss. This advantage is illustrated in FIGS. 14A & 14B.

Figure 14A:
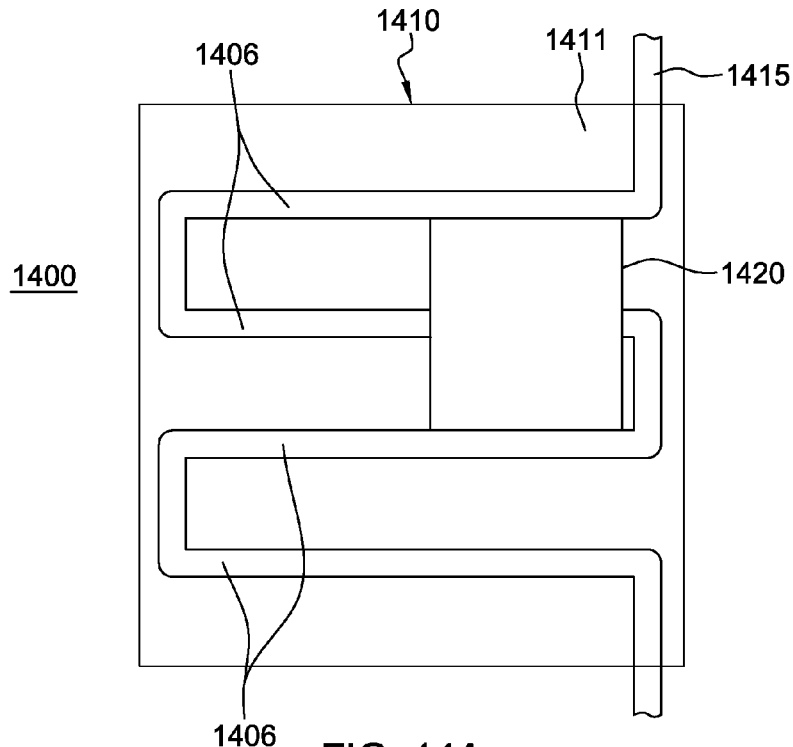
FIG. 14A depicts an alternate embodiment of a cooling apparatus comprising a liquid-cooled cold plate coupled to an electronic component in a manner offset from the center of the liquid-cooled cold plate, in accordance with one or more aspects of the present invention.

By way of example, FIG. 14A depicts (in bottom plan view) a cooling apparatus 1400 comprising a liquid-cooled cold plate 1410, shown coupled to an electronic component 1420 (such as a processor module) to be cooled. Liquid-cooled cold plate 1410 includes a thermally conductive structure 1411 and one or more coolant-carrying tubes 1415 extending within thermally conductive structure 1411. As in the embodiments described above, coolant-carrying tube(s) 1415 comprises multiple coolant-carrying channel sections 1406 disposed, in this example, substantially parallel to each other within thermally conductive structure 1411. By off-centering electronic component 1420 from the center of the liquid-cooled cold plate, there is (shown by way of example) a single coolant-carrying channel section 1406 passing through the first region of the cold plate aligned to electronic component 1420. Thus, thermal transfer performance of this cooling apparatus might be degraded from that of the cold plate described above in connection with FIGS. 11A & 11B.

Figure 14B:
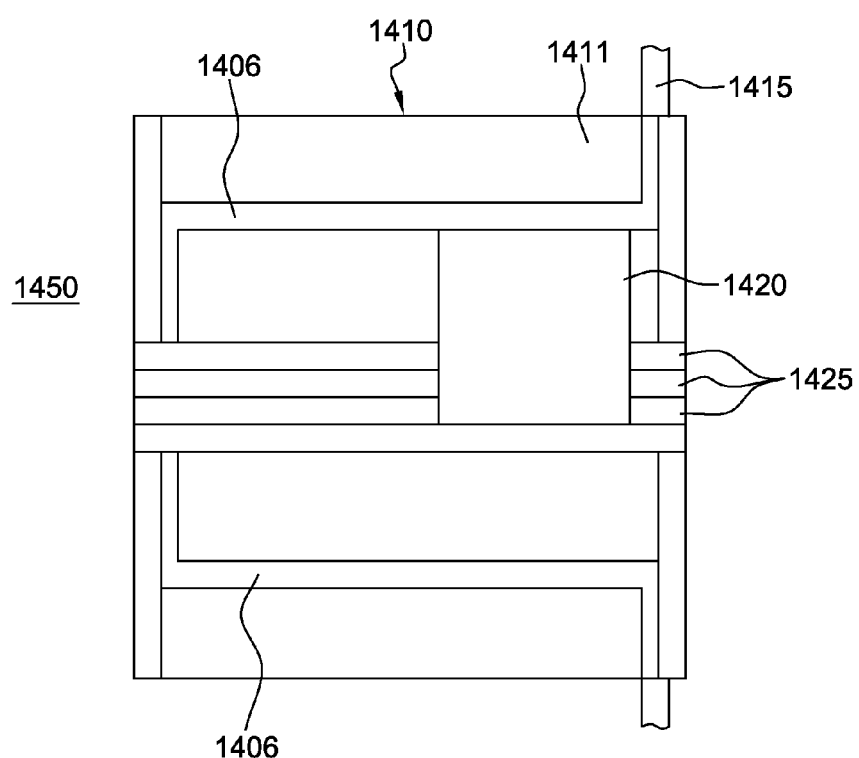
FIG. 14B depicts the cooling apparatus of FIGS. 12A-12C, coupled to an electronic component in a manner offset from the center of the liquid-cooled cold plate, in accordance with one or more aspects of the present invention.

FIG. 14B illustrates the advantage of incorporating a thermal spreader with embedded heat pipes as described herein between the electronic component and the cold plate. Specifically, FIG. 14B illustrates a cooling apparatus 1450 comprising a liquid-cooled cold plate 1410 (such as described above in connection with FIG. 14A), and a thermal spreader disposed between electronic component 1420 and liquid-cooled cold plate 1410. The thermal spreader includes multiple heat pipe sections 1425, some of which are shown disposed between electronic component 1420 and liquid-cooled cold plate 1410, notwithstanding off-centering of the electronic component from the cold plate. These heat pipe sections 1425 thus align at least partially to the above-described first region of the liquid-cooled cold plate, and partially align to the second region of liquid-cooled cold plate. Thus, the thermal spreader with embedded heat pipe(s) facilitates lateral spreading of heat within the cooling apparatus, and thereby facilitates handling the electronic component to cold plate size differential, as well as offsetting of the electronic component relative to the center of the cold plate, and is particularly beneficial in a warm-liquid-cooling approach (such as described above).

FIG. 15A depicts an alternate embodiment of a cooling apparatus 1500, in accordance with an aspect of the present invention. As shown, cooling apparatus 1500 comprises a liquid-cooled cold plate 1510 comprising one or more coolant-carrying tubes 1512 extending within a thermally conductive structure 1514 of liquid-cooled cold plate 1510. In one example, the one or more coolant-carrying tubes 1512 might comprise copper tubes, and the thermally conductive material 1514 an aluminum block, with the copper tubes being soldered within the aluminum block in one configuration. Cooling apparatus 1500 further includes a thermal spreader 1520 comprising one or more embedded heat pipes, such as described above. In one embodiment, thermal spreader 1520 is an aluminum block, within which the one or more heat pipes are embedded. Thermal spreader 1520 is (in one embodiment) detachably mounted to a thermal conduction surface 1511 of liquid-cooled cold plate 1510, for example, via an epoxy or brazed joint. As described above, cooling apparatus 1500 detachably mounts to a surface 1531 of an electronic component 1530 (for example, a processor module) to be cooled, and liquid-cooled cold plate 1510 comprises a first region 1515 defined by a projection of where the surface to be cooled 1531 aligns to the cold plate, and a second region 1517 comprising that region of the cold plate outside first region 1515. As in the examples discussed above, thermal spreader 1520 includes one or more heat pipes comprising one or more heat pipe sections disposed to partially align to first region 1515 of liquid-cooled cold plate 1510, and to partially align to second region 1517 of liquid-cooled cold plate 1517, which facilitates lateral heat transfer from the electronic component to coolant-carrying channel sections of liquid-cooled cold plate 1510 in the second region 1517 of the liquid-cooled cold plate.

FIG. 15B illustrates one detailed embodiment of thermal spreader 1520. In this embodiment, thermal spreader 1520 includes a thermally conductive structure 1521, such as a metal plate or a block, with multiple U-shaped heat pipes 1522 and a single straight heat pipe 1524 embedded therein, which illustrates one pattern designed to laterally spread heat outward from the electronic component into the cold plate. With the electronic component disposed as illustrated in FIG. 15A, each heat pipe 1522, 1524 (FIG. 15B) at least partially aligns to the first region 1515 of the liquid-cooled cold plate, and to the second region 1517 of the liquid-cooled cold plate, thereby facilitating transfer of heat out to the coolant-carrying tube sections in second region 1517 of the liquid-cooled cold plate.

FIG. 15C illustrates one embodiment of a liquid-cooled cold plate 1510, wherein a single coolant-carrying tube 1512 is shown embedded within thermally conductive structure 1514. In this example, a coolant inlet port 1508 and coolant outlet port 1509 are illustrated as extending from a common side edge of liquid-cooled cold plate 1510. The placement of the ports may be optimized depending on the specific cooling application. As explained above, a liquid-cooled cold plate 1510 such as illustrated in FIG. 15C is substantially less costly to manufacture than a micro-channel cold plate, such as illustrated in FIG. 10A.

Note that in the embodiments of FIGS. 15A-15C, thermal conduction surface 1511 of liquid-cooled cold plate 1510 is larger than the surface 1531 to be cooled of electronic component 1530, and (in this example) the surface area of the main, opposite sides of thermal spreader 1520 are substantially the same as that of thermal conduction surface 1511 of liquid-cooled cold plate 1510. As noted, thermal spreader 1520 may be detachable or integrated with the liquid-cooled cold plate structure. Note that, in one example, the surface area of thermal conduction surface 1511 may be two times (or more) larger than that of the surface 1531 to be cooled of the electronic component. If desired, appropriate alignment features may be provided on the liquid-cooled cold plate and the thermal spreader to facilitate aligning the thermal spreader to the liquid-cooled cold plate, and/or to the electronic component. Note that the particular heat pipe(s) configuration and layout within the thermal spreader, as well as the particular coolant-carrying tube(s) configuration and layout within the cold plate, may be optimized for a particular application. In most applications, the heat pipes embedded within the thermal spreader cover a significant portion of the footprint of the thermal spreader.

Figure 16A:
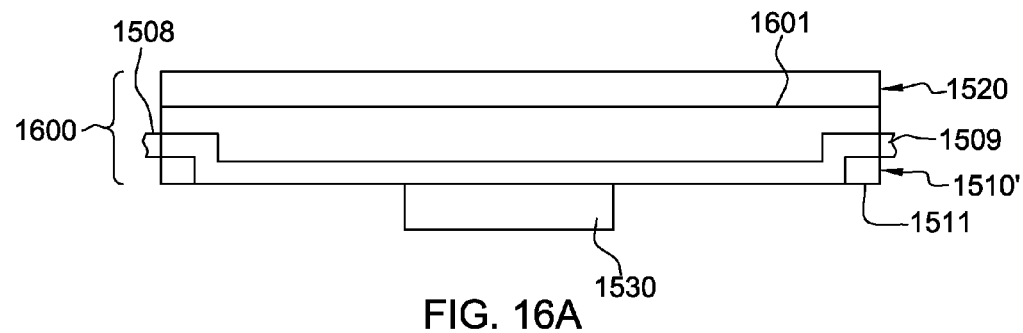
FIG. 16A depicts an alternate embodiment of a cooling apparatus comprising a liquid-cooled cold plate and a thermal spreader, and shown coupled to an electronic component to be cooled, in accordance with one or more aspects of the present invention.
Figure 16B:
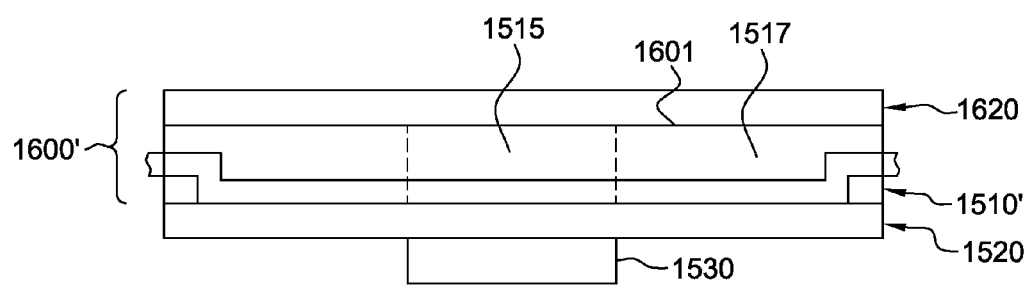
FIG. 16B depicts another embodiment of a cooling apparatus comprising a liquid-cooled cold plate and multiple thermal spreaders, and shown coupled to an electronic component to be cooled, in accordance with one or more aspects of the present invention.
Figure 16C:
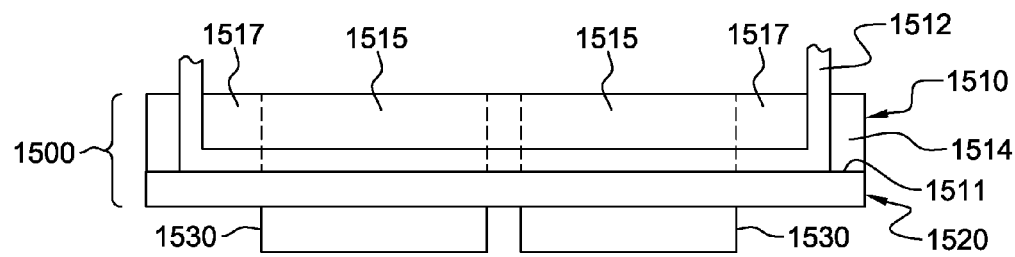
FIG. 16C illustrates the cooling apparatus of FIG. 16A, shown coupled to multiple electronic components to be cooled, in accordance with one or more aspects of the present invention.

FIGS. 16A-16C depict various alternate embodiments of the cooling apparatus of FIGS. 15A-15C.

In FIG. 16A, a cooling apparatus 1600 is depicted with a thermal spreader 1520 coupled to a main surface 1601 of the liquid-cooled cold plate 1510' on an opposite side of the cold plate from thermal conduction surface 1511, meaning that, in this embodiment, the cold plate is disposed between electronic component 1530 and thermal spreader 1520. Also note that, by way of example, the liquid-cooled cold plate 1510' comprises coolant inlet port 1508 and coolant outlet port 1509 disposed at opposite side edges of the liquid-cooled cold plate.

In FIG. 16B, a cooling apparatus 1600' is illustrated similar to the cooling apparatus described above in connection with FIG. 15A, but with the addition of a second thermal spreader 1620 coupled to main surface 1601 of liquid-cooled cold plate 1510 on the opposite side of the cold plate from the thermal conduction surface. By way of example, the first thermal spreader 1520 and second thermal spreader 1620 each have one or more heat pipes embedded therein with one or multiple heat pipe sections partially aligned to the first region 1515 of liquid-cooled cold plate 1510, and at least partially aligned to the second region 1517 of the liquid-cooled cold plate.

In FIG. 16C, the cooling apparatus 1500 of FIG. 15A is shown coupled to multiple electronic components 1530. By way of example, cooling apparatus 1500 might couple to two or more electronic components, such as two or more processor modules. Thus, the cooling apparatus disclosed herein (with the electronic module to cold plate size differential), allows greater flexibility for use of the same cold plate design to cool multiple electronic components of an electronic system.

Figure 17A:
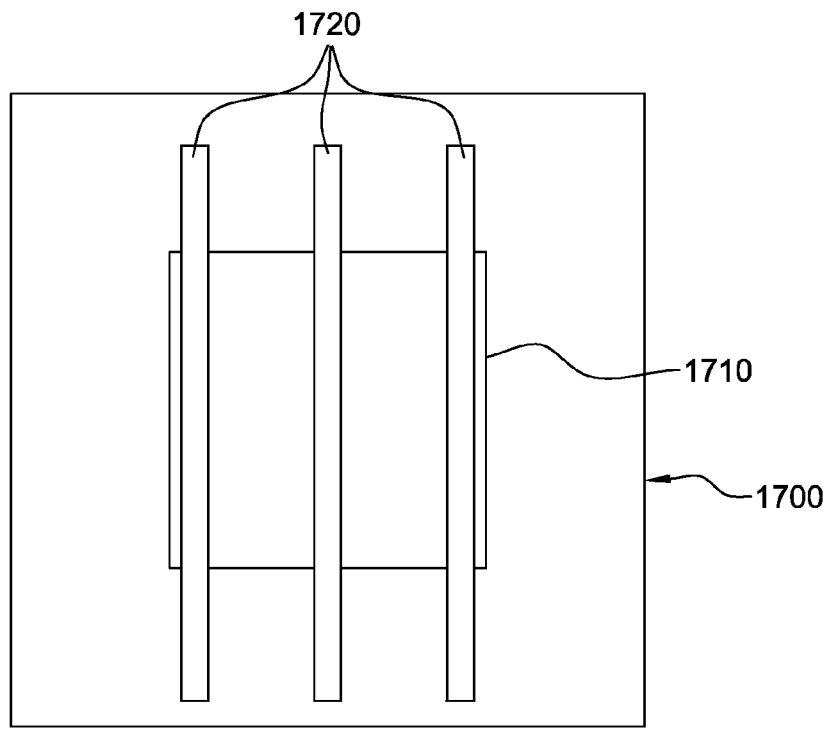
FIG. 17A depicts an alternate embodiment of a thermal spreader for a cooling apparatus such as disclosed herein, and shown coupled to an electronic component to be cooled, in accordance with one or more aspects of the present invention.

FIGS. 17A-17D depict various embodiments of a thermal spreader 1700 of a cooling apparatus such as described above in connections with FIGS. 12A-12C & 14B-16C. In these figures, thermal spreader 1700 is coupled to an electronic component 1710 to be cooled. In FIG. 17A, three heat pipes 1720 are shown embedded within the thermal spreader. These heat pipes 1720 are straight heat pipes, shown substantially parallel to each other, and of sufficient size and spacing to extend partially over the surface to be cooled of electronic component 1710, and partially outside of the surface to be cooled, thereby facilitating lateral spreading of heat from the region over the surface to be cooled outward within the cooling apparatus, as described above.

Figure 17B:
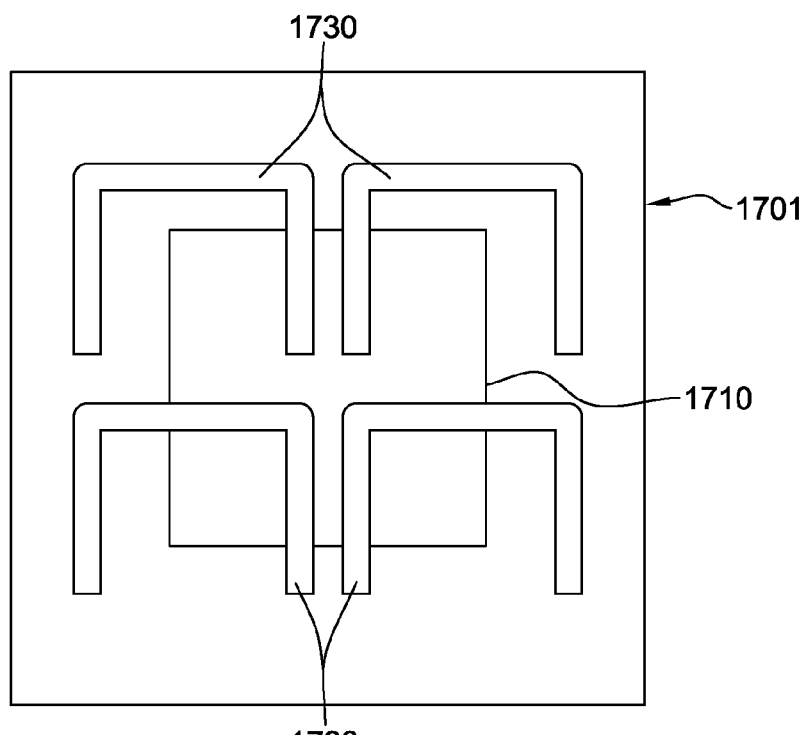
FIG. 17B depicts another embodiment of a thermal spreader for a cooling apparatus such as disclosed herein, and shown coupled to an electronic component to be cooled, in accordance with one or more aspects of the present invention.

In the embodiment of FIG. 17B, multiple U-shaped heat pipes 1730 are substituted for the multiple straight heat pipes 1720 of the cooling apparatus embodiment of FIG. 17A. In this embodiment, thermal spreader 1701 is shown coupled to electronic component 1710 to be cooled to facilitate lateral spreading of heat within the cooling apparatus from the electronic component outward to regions of the cooling apparatus disposed outside a projection of the surface to be cooled into the cooling apparatus.

Figure 17C:
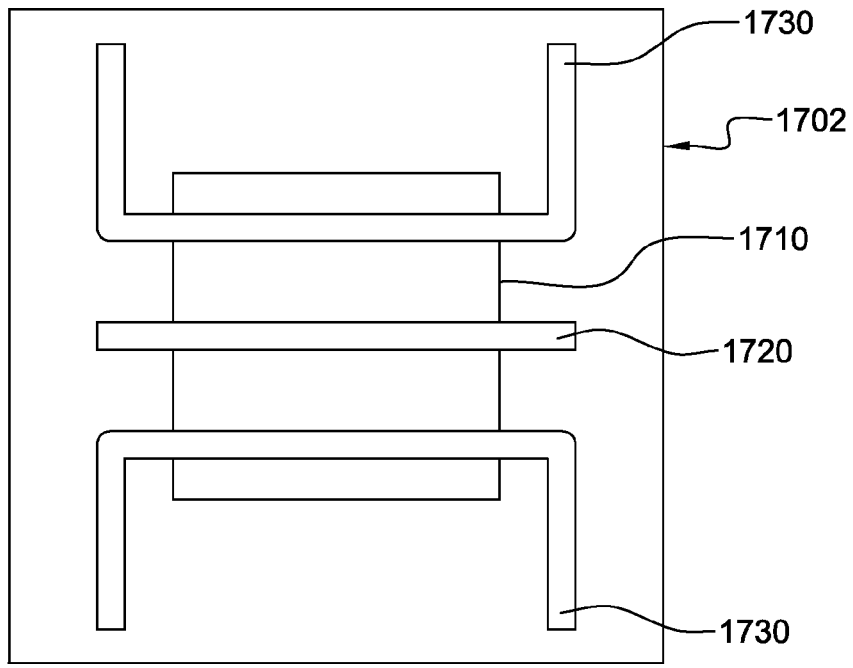
FIG. 17C depicts an alternate embodiment of a thermal spreader for a cooling apparatus such as disclosed herein, and shown coupled to an electronic component to be cooled, in accordance with one or more aspects of the present invention.

In FIG. 17C, a thermal spreader 1702 is illustrated comprising multiple U-shaped heat pipes 1730, and a single straight heat pipe 1720. In this embodiment, U-shaped heat pipes 1730 and straight heat pipe 1720 are sized and configured to again extend partially over the surface to be cooled of electronic component 1710 and partially into the second region of the cooling apparatus disposed outside of the first region.

Figure 17D:
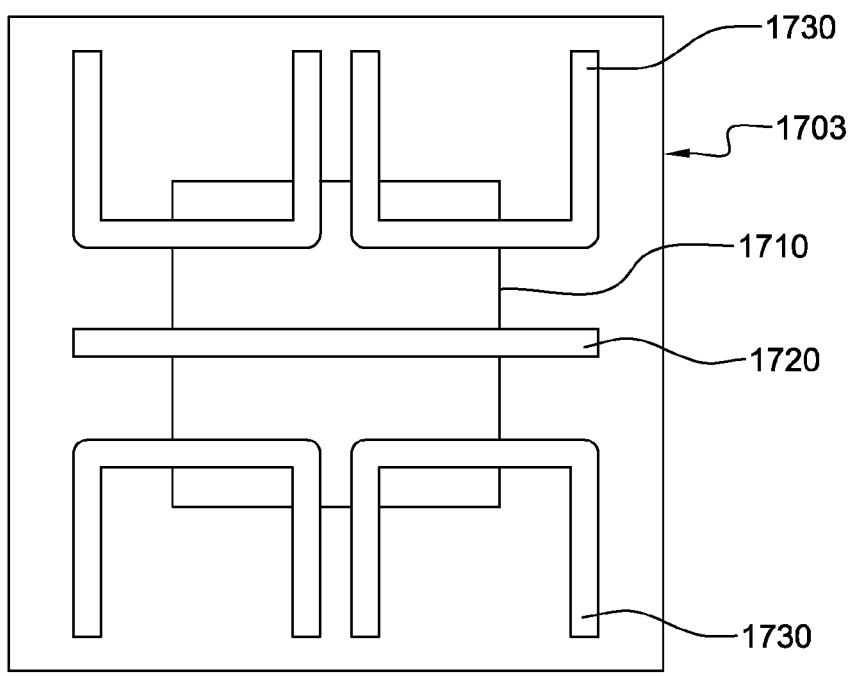
FIG. 17D depicts another embodiment of a thermal spreader for a cooling apparatus such as disclosed herein, and shown coupled to an electronic component to be cooled, in accordance with one or more aspects of the present invention.

In FIG. 17D, a thermal spreader 1703 is illustrated comprising multiple smaller, U-shaped heat pipes 1730 and a single straight heat pipe 1720. As with the above-described embodiments, portions of these heat pipes align over the surface to be cooled, and extend into the region of the cooling apparatus outside of the surface to be cooled, thereby facilitating lateral transfer of heat within the cooling apparatus.

Note that the above-described embodiments are provided by way of example, only. The integration of high-efficiency cold plates and thermal spreading employing heat pipes significantly enhances the thermal transfer effectiveness of the cold plate design. Advantageously, in the cooling apparatuses disclosed herein, a common design may be employed to cool different electronic components, notwithstanding different component locations, sizes and heat fluxes. This reduces the number of parts required to implement a liquid-cooled cooling approach, and thereby provides benefit to the supply chain. That is, a single cooling apparatus part may be employed to facilitate liquid-cooling of multiple different electronic components.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating dissipation of heat from at least one electronic component, the method comprising:
   providing a cooling apparatus configured to couple to at least one electronic component to be cooled, the cooling apparatus having a larger footprint size than the at least one electronic component to be cooled, and the cooling apparatus comprising:
      a liquid-cooled cold plate comprising a thermally conductive material with a plurality of coolant-carrying channel sections extending therein, the liquid-cooled cold plate comprising a thermal conduction surface having a first surface area, and wherein the at least one electronic component comprises a surface to be cooled, the surface to be cooled comprising a second surface area, wherein the liquid-cooled cold plate is oversized relative to the at least one electronic component, with the first surface area of the thermal conduction surface being greater than the second surface area of the surface to be cooled and in operation, heat is transferred from the surface to be cooled of the at least one electronic component to the thermal conduction surface of the liquid-cooled cold plate, and the liquid-cooled cold plate comprises a first region where the surface to be cooled aligns to the liquid-cooled cold plate and a second region outside the first region, and wherein at least one first coolant-carrying channel section of the plurality of coolant-carrying channel sections is disposed, at least in part, within the first region, and at least one second coolant-carrying channel section of the plurality of coolant-carrying channel sections of the liquid-cooled cold plate is disposed in the second region, outside the first region, and laterally offset from the electronic component;
      at least one coolant-carrying tube, the at least one coolant-carrying tube extending into, through and out from, the liquid-cooled cold plate and being embedded within the thermally conductive material at the thermal conduction surface where extending through the liquid-cooled cold plate, the at least one coolant-carrying tube being exposed at the thermal conduction surface of the liquid-cooled cold plate so as to be coupled to a first main surface of a first thermal spreader, the at least one coolant-carrying tube comprising the plurality of coolant-carrying channel sections;
      the first thermal spreader being disposed between the at least one electronic component and the liquid-cooled cold plate, and having the first main surface and an opposing second main surface, the first main surface of the first thermal spreader being coupled to the thermal conduction surface of the liquid-cooled cold plate, and the first thermal spreader being a block of thermally conductive material with a plurality of heat pipes disposed therein, each heat pipe comprising multiple heat pipe sections, at least one heat pipe section of the multiple heat pipe sections being partially aligned to the first region of the liquid-cooled cold plate, between the at least one electronic component and the at least one first coolant-carrying channel section of the liquid-cooled cold plate, and partially aligned to the second region of the liquid-cooled cold plate, below the at least one second coolant-carrying channel section of the liquid-cooled cold plate, laterally away from the at least one electronic component, the plurality of heat pipes of the first thermal spreader facilitating distributing heat laterally outward from the at least one electronic component to the at least one second coolant-carrying channel section of the liquid-cooled cold plate in the second region of the liquid-cooled cold plate, and wherein the plurality of heat pipes are discrete heat pipe structures inserted into the block of thermally conductive material of the first thermal spreader so that the heat pipes physically contact each other lengthwise between the at least one electronic component and the first region of the liquid-cooled cold plate; and
      a second thermal spreader, the second thermal spreader being coupled to a main surface of the liquid-cooled cold plate, the main surface of the liquid-cooled cold plate and the thermal conduction surface of the liquid-cooled cold plate being opposite sides of the liquid-cooled cold plate; and wherein the first thermal spreader and the liquid-cooled cold plate are co-extensive.

2. The method of claim 1, wherein the first thermal spreader and the liquid-cooled cold plate are each integrated within a common, thermally conductive structure.

3. The method of claim 1, wherein the first region of the liquid-cooled cold plate is offset from a center of the liquid-cooled cold plate.

4. The method of claim 1, wherein the at least one electronic component comprises multiple electronic components, including a first electronic component and a second electronic component, and wherein both the first electronic component and the second electronic component are coupled to the first thermal spreader.

5. The method of claim 1, wherein a first heat pipe section of the multiple heat pipe sections of the first thermal spreader is a U-shaped heat pipe section.

6. The method of claim 5, wherein a second heat pipe section of the multiple heat pipe sections of the first thermal spreader is a straight heat pipe section.

7. The method of claim 1, further comprising:
providing a coolant loop coupled in fluid communication with the plurality of coolant-carrying channel sections of the liquid-cooled cold plate; and
providing an outdoor-air-cooled heat exchange unit coupled to facilitate heat transfer from the liquid-cooled cold plate to the outdoor-air-cooled heat exchange unit via, at least in part, the coolant loop, the outdoor-air-cooled heat exchange unit cooling coolant passing through the coolant loop by dissipating heat from the coolant to outdoor ambient air.

8. A method comprising:
providing at least one electronic component; and
providing a cooling apparatus coupled to the at least one electronic component for dissipating heat from the at least one electronic component, the cooling apparatus having a larger footprint size than the at least one electronic component, and comprising:
a liquid-cooled cold plate comprising a thermally conductive material with a plurality of coolant-carrying channel sections extending therein, the liquid-cooled cold plate comprising a thermal conduction surface having a first surface area, and wherein the at least one electronic component comprises a surface to be cooled, the surface to be cooled comprising a second surface area, wherein the liquid-cooled cold plate is oversized relative to the at least one electronic component, with the first surface area of the thermal conduction surface of the liquid-cooled cold plate being greater than the second surface area of the surface to be cooled of the at least one electronic component, and in operation, heat is transferred from the surface to be cooled of the at least one electronic component to the thermal conduction surface of the liquid-cooled cold plate, and the liquid-cooled cold plate comprises a first region where the surface to be cooled aligns to the liquid-cooled cold plate and a second region outside the first region, and wherein at least one first coolant-carrying channel section of the plurality of coolant-carrying channel section is disposed, at least in part, within the first region, and at least one second coolant-carrying channel section of the plurality of coolant-carrying channel sections of the liquid-cooled cold plate is disposed in the second region, outside the first region, and laterally offset from the electronic component;
at least one coolant-carrying tube, the at least one coolant-carrying tube extending into, through and out from, the liquid-cooled cold plate and being embedded within the thermally conductive material at the thermal conduction surface where extending through the liquid-cooled cold plate, the at least one coolant-carrying tube being exposed at the thermal conduction surface of the liquid-cooled cold plate so as to be coupled to a first main surface of a first thermal spreader, the at least one coolant-carrying tube comprising the plurality of coolant-carrying channel sections;
the first thermal spreader being disposed between the electronic component and the liquid-cooled cold plate, and having the first main surface and an opposing second main surface, the first main surface of the first thermal spreader being coupled to the thermal conduction surface of the liquid-cooled cold plate, and the first thermal spreader being a block of thermally conductive material with a plurality of heat pipes disposed therein, each heat pipe comprising multiple heat pipe sections, at least one heat pipe section of the multiple heat pipe sections being partially aligned to the first region of the liquid-cooled cold plate, between the electronic component and the at least one first coolant-carrying channel section of the liquid-cooled cold plate, and partially aligned to the second region of the liquid-cooled cold plate, below the at least one second coolant-carrying channel section of the liquid cold plate, laterally away from the electronic component, the plurality of heat pipes of the first thermal spreader facilitating distributing heat laterally outward from the electronic component to the at least one second coolant-carrying channel section of the liquid-cooled cold plate in the second region of the liquid-cooled cold plate, and wherein the plurality of heat pipes are discrete heat pipe structures inserted into the block of thermally conductive material of the first thermal spreader so that the heat pipes physically contact each other lengthwise between the electronic component and the first region of the liquid-cooled cold plate;
a second thermal spreader, the second thermal spreader being coupled to a main surface of the liquid-cooled cold plate, the main surface of the liquid-cooled cold plate and the thermal conduction surface of the liquid-cooled cold plate being opposite sides of the liquid-cooled cold plate; and
wherein the first thermal spreader and the liquid-cooled cold plate are co-extensive.

9. The method of claim 8, wherein the first region of the liquid-cooled cold plate is offset from a center of the liquid-cooled cold plate.

* * * * *